(12) United States Patent
Yang et al.

(10) Patent No.: US 11,276,352 B2
(45) Date of Patent: Mar. 15, 2022

(54) DISPLAY DEVICE WITH IMPROVED CURRENT DRIVE, REDUCED CIRCUIT AREA AND POWER CONSUMPTION

(71) Applicants: Samsung Display Co., LTD., Yongin-si (KR); Konkuk University Industrial Cooperation Corp, Seoul (KR)

(72) Inventors: Tae Hoon Yang, Yongin-si (KR); Joon Ho Lee, Seongnam-si (KR); Kee Chan Park, Seoul (KR); Ki Bum Kim, Hwaseong-si (KR); Hyang A Park, Seoul (KR); Jong Chan Lee, Suwon-si (KR); Woong Hee Jeong, Seoul (KR)

(73) Assignees: SAMSUNG DISPLAY CO., LTD., Gyeonggi-Do (KR); KONKUK UNIVERSITY INDUSTRIAL COOPERATION CORP, Seoul (KR)

( * ) Notice: Subject to any disclaimer, the term of this patent is extended or adjusted under 35 U.S.C. 154(b) by 0 days.

(21) Appl. No.: 17/075,472

(22) Filed: Oct. 20, 2020

(65) Prior Publication Data

US 2021/0118375 A1 Apr. 22, 2021

(30) Foreign Application Priority Data

Oct. 21, 2019 (KR) .................. 10-2019-0130952

(51) Int. Cl.
*G09G 3/3266* (2016.01)
*G09G 3/20* (2006.01)

(52) U.S. Cl.
CPC ......... *G09G 3/3266* (2013.01); *G09G 3/2092* (2013.01); *G09G 2310/0278* (2013.01); *G09G 2310/0286* (2013.01); *G09G 2310/0291* (2013.01)

(58) Field of Classification Search
None
See application file for complete search history.

(56) References Cited

U.S. PATENT DOCUMENTS

2008/0036725 A1* 2/2008 Lee .................. G09G 3/3677
345/100
2014/0152629 A1* 6/2014 So .................... G09G 3/3266
345/205

(Continued)

FOREIGN PATENT DOCUMENTS

KR 19970022418 A 5/1997
KR 1020130099588 A 9/2013

*Primary Examiner* — Chad M Dicke
(74) *Attorney, Agent, or Firm* — Cantor Colburn LLP

(57) ABSTRACT

A display device includes: a plurality of pixels, each of which is connected to a corresponding one of a plurality of scan lines, and a scan driver including a plurality of stages, each of which supplies a scan signal to a corresponding one of the scan lines, each of the stages includes: a node controller which supplies a second output signal of a previous stage to a first node based on an input signal of a first clock terminal or a first output signal of the previous stage, a first inverter connected between the first node and a second node, a buffer which supplies a voltage of the second node to a first output terminal based on an input signal of a second clock terminal, and a second inverter connected between the first output terminal and a second output terminal.

19 Claims, 17 Drawing Sheets

(56) References Cited

U.S. PATENT DOCUMENTS

| | | | |
|---|---|---|---|
| 2015/0287376 A1* | 10/2015 | Lim | G09G 3/3677 |
| | | | 345/92 |
| 2015/0303925 A1 | 10/2015 | Qi et al. | |
| 2016/0049136 A1* | 2/2016 | Seo | G09G 3/3677 |
| | | | 345/213 |
| 2016/0225462 A1 | 8/2016 | Harada | |
| 2016/0372070 A1* | 12/2016 | Hu | G09G 3/36 |
| 2017/0221439 A1* | 8/2017 | Chen | G11C 19/28 |
| 2018/0059829 A1* | 3/2018 | Chen | G09G 3/3677 |
| 2018/0130410 A1* | 5/2018 | Gao | G09G 3/3225 |

\* cited by examiner

DISPLAY DEVICE WITH IMPROVED CURRENT DRIVE, REDUCED CIRCUIT AREA AND POWER CONSUMPTION

This application claims priority to Korean Patent Application No. 10-2019-0130952, filed on Oct. 21, 2019, and all the benefits accruing therefrom under 35 U.S.C. § 119, the content of which in its entirety is herein incorporated by reference.

BACKGROUND

1. Field

The disclosure relates to a display device.

2. Description of the Related Art

As the information society develops, the demands for display devices for displaying images are increasing in various forms. Such display devices are widely applied to various electronic devices such as smart phones, digital cameras, laptop computers, navigation devices, and smart televisions, for example. The display devices may be flat panel display devices such as liquid crystal display devices, field emission display devices, organic light emitting display devices, and the like. Among various types of flat panel display devices, an organic light emitting display device includes light-emitting elements, which allow pixels of a display panel to emit light by itself, so that images may be displayed without a backlight unit for providing light to the display panel.

Such an organic light emitting display device may include a display panel including data lines and scan lines and a plurality of pixels connected to the data lines and the scan lines, data drivers for supplying data signals to the data lines, and scan drivers including shift registers for supplying scan signals to the scan lines.

The pixels may receive data signals supplied from the data drivers to the data lines to be synchronized with the scan signals supplied from the scan drivers to the scan lines to display images corresponding to the data signals.

SUMMARY

Embodiments of the disclosure provide a display device with improved current drive capability and with reduced circuit area and power consumption.

According to an embodiment of the invention, a display device includes: a plurality of pixels, where each of the pixels is connected to a corresponding one of a plurality of scan lines, and a scan driver including a plurality of stages, where each of the stages supplies a scan signal to a corresponding one of the scan lines. In such an embodiment, each of the stages includes: a node controller which supplies a second output signal of a previous stage to a first node based on an input signal of a first clock terminal or a first output signal of the previous stage, a first inverter connected between the first node and a second node, a buffer which supplies a voltage of the second node to a first output terminal based on an input signal of a second clock terminal, and a second inverter connected between the first output terminal and a second output terminal.

In an embodiment, the node controller may include: a first transistor which supplies the second output signal of the previous stage to the first node, when the input signal of the first clock terminal has a gate low voltage, and a second transistor which supplies the second output signal of the previous stage to the first node, when the first output signal of the previous stage has a gate high voltage.

In an embodiment, a gate electrode of the first transistor may be connected to the first clock terminal of the stage, a first electrode of the first transistor may be connected to a second start terminal of the stage, and a second electrode of the first transistor may be connected to the first node. In such an embodiment, a gate electrode of the second transistor may be connected to a first start terminal of the stage, a first electrode of the second transistor may be connected to the second start terminal of the stage, and a second electrode of the second transistor may be connected to the first node.

In an embodiment, the first inverter may include: a fifth transistor which supplies a gate high voltage to the second node, when the first node has a gate low voltage, and a sixth transistor which supplies the gate low voltage to the second node, when the first node has the gate high voltage.

In an embodiment, a gate electrode of the fifth transistor may be connected to the first node, a first electrode of the fifth transistor may be connected to a gate high voltage line which supply a supplies high voltage, and a second electrode of the fifth transistor may be connected to the second node. In such an embodiment, a gate electrode of the sixth transistor may be connected to the first node, a first electrode of the sixth transistor may be connected to the second node, and a second electrode of the sixth transistor may be connected to a gate low voltage line which supplies a gate low voltage.

In an embodiment, the buffer may include: a third transistor which supplies the voltage of the second node to the first output terminal, when the input signal of the second clock terminal has a gate low voltage, and a fourth transistor which supplies the gate low voltage to the first output terminal, when the input signal of the second clock terminal has a gate high voltage.

In an embodiment, a gate electrode of the third transistor may be connected to the second clock terminal of the stage, a first electrode of the third transistor may be connected to the second node, and a second electrode of the third transistor may be connected to the first output terminal. In such an embodiment, a gate electrode of the fourth transistor may be connected to the second clock terminal of the stage, a first electrode of the fourth transistor may be connected to the first output terminal, and a second electrode of the fourth transistor may be connected to a gate low voltage line which supplies the gate low voltage.

In an embodiment, the second inverter may include: a seventh transistor which supplies a gate high voltage to the second output terminal, when the first output terminal has a gate low voltage, and an eighth transistor which supplies the gate low voltage to the second output terminal, when the first output terminal has the gate high voltage.

In an embodiment, a gate electrode of the seventh transistor may be connected to the first output terminal, a first electrode of the seventh transistor may be connected to a gate high voltage line which supplies the gate high voltage, and a second electrode of the seventh transistor may be connected to the second output terminal. In such an embodiment, a gate electrode of the eighth transistor may be connected to the first output terminal, a first electrode of the eighth transistor may be connected to the second output terminal, and a second electrode of the eighth transistor may be connected to a gate low voltage line which supplies the gate low voltage.

In an embodiment, each of the stages may further include a third inverter connected between the second output terminal and a third output terminal.

In an embodiment, the third inverter may include: a ninth transistor which supplies a gate high voltage to the third output terminal, when the second output terminal has a gate low voltage, and a tenth transistor which supplies the gate low voltage to the third output terminal, when the second output terminal has the gate high voltage.

In an embodiment, a gate electrode of the ninth transistor may be connected to the second output terminal, a first electrode of the ninth transistor may be connected to a gate high voltage line which supplies the gate high voltage, and a second electrode of the ninth transistor may be connected to the third output terminal. In such an embodiment, a gate electrode of the tenth transistor may be connected to the second output terminal, a first electrode of the tenth transistor may be connected to the third output terminal, and a second electrode of the tenth transistor may be connected to a gate low voltage line which supplies the gate low voltage.

In an embodiment, each of the stages may further comprise a capacitor connected between the first node and a gate low voltage line.

In an embodiment, a $(2n-1)^{th}$ stage among the stages may receive a first clock signal at the first clock terminal and may receive a second clock signal at the second clock terminal, where n is a natural number. In such an embodiment, a $2n^{th}$ stage among the stages may receive the second clock signal at the first clock terminal and may receive the first clock signal at the second clock terminal.

In an embodiment, a first start terminal of a $k^{th}$ stage among the stages may be connected to a first output terminal of a $(k-1)^{th}$ stage, and a second start terminal of the $k^{th}$ stage may be connected to a second output terminal of the $(k-1)^{th}$ stage, where k is a natural number of two or greater.

In an embodiment, each of the plurality of pixels may comprise: a light-emitting element, a driving transistor which control a drive current flowing in the light-emitting element, a first switching transistor which selectively supplies an initialization voltage to a gate electrode of the driving transistor, a second switching transistor which selectively supplies a data voltage to a first electrode of the driving transistor, a third switching transistor which selectively connects a second electrode of the driving transistor to the gate electrode thereof, a fourth switching transistor which selectively supplies the initialization voltage to a first electrode of the light-emitting element, a fifth switching transistor which selectively supplies a drive voltage to the first electrode of the driving transistor, and a sixth switching transistor which selectively connects the second electrode of the driving transistor to the first electrode of the light-emitting element.

In an embodiment, the second switching transistors and the third switching transistors of the pixels arranged in a $k^{th}$ row among the plurality of pixels may be turned on based on an output signal of the second output terminal of a $k^{th}$ stage among the stages, where k is a natural number of two or greater.

In an embodiment, the first switching transistors of the pixels arranged in a $k^{th}$ row among the plurality of pixels may be turned on based on an output signal of the third output terminal of a $(k-1)^{th}$ stage among the stages, where k is a natural number of two or greater.

In an embodiment, the fourth switching transistors of the pixels arranged in a $k^{th}$ row among the plurality of pixels may be turned on based on an output signal of the third output terminal of a $k^{th}$ stage among the stages, where k is a natural number of two or greater.

In an embodiment, types of the first switching transistor and the fourth switching transistor may be different from types of the second switching transistor and the third switching transistor.

BRIEF DESCRIPTION OF THE DRAWINGS

The above and other features of the disclosure will become more apparent by describing exemplary embodiments thereof in detail with reference to the attached drawings, in which.

DETAILED DESCRIPTION

Figure 1:
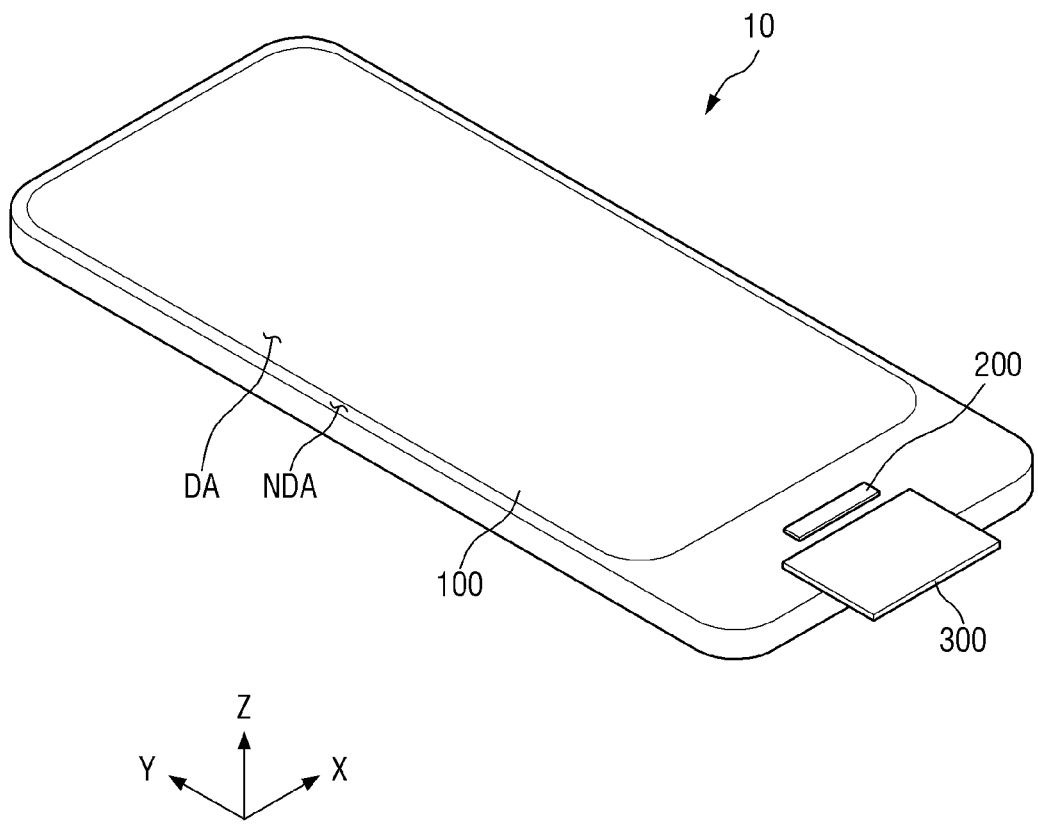
FIG. 1 is a perspective view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. "Or" means "and/or." As used herein, the term "and/or" includes any and all combinations of one or more of the associated listed items. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the invention will be described in detail with reference to the accompanying drawings.

Figure 2:
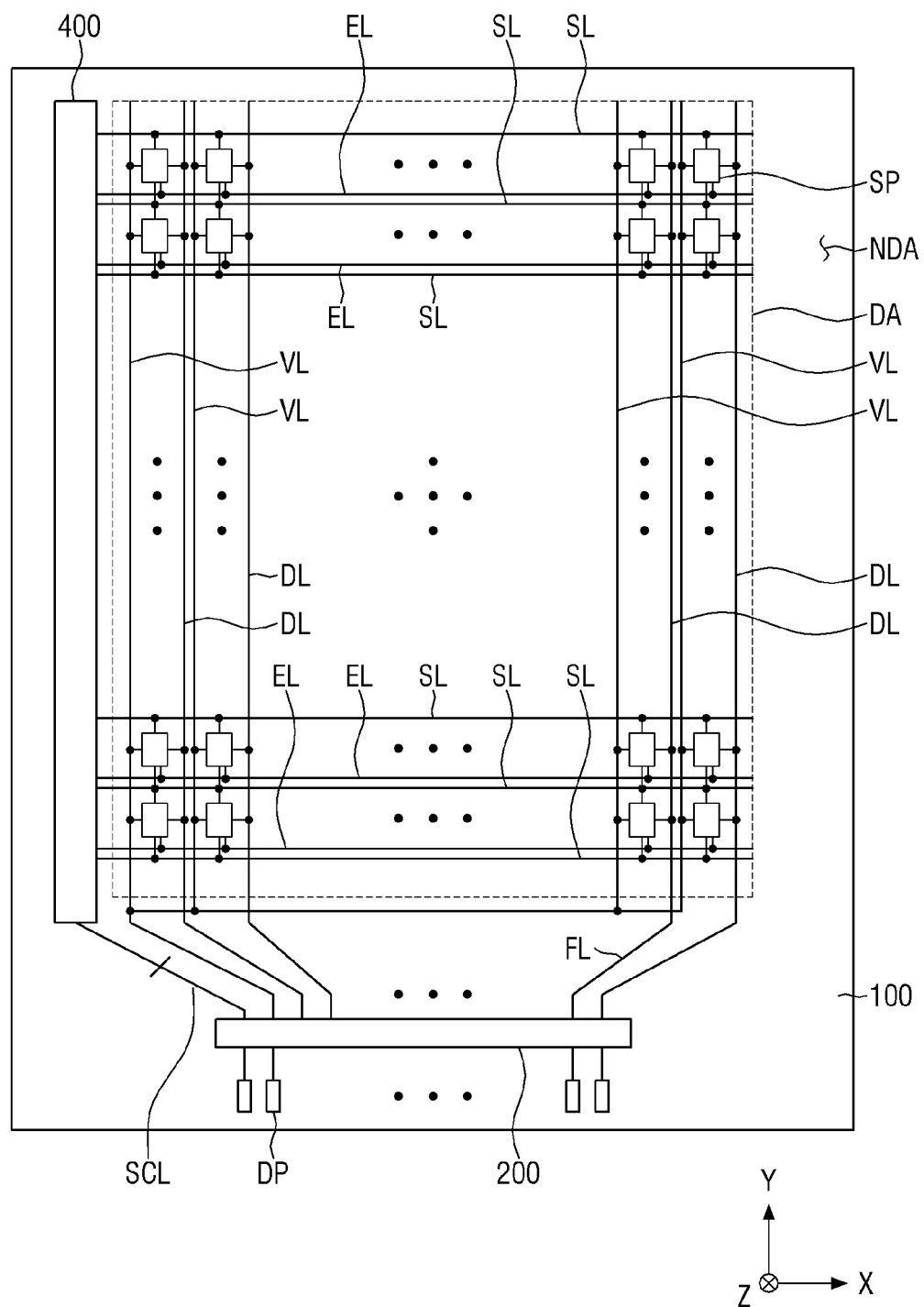
FIG. 2 is a plan view illustrating the display device according to an embodiment.
Figure 3:
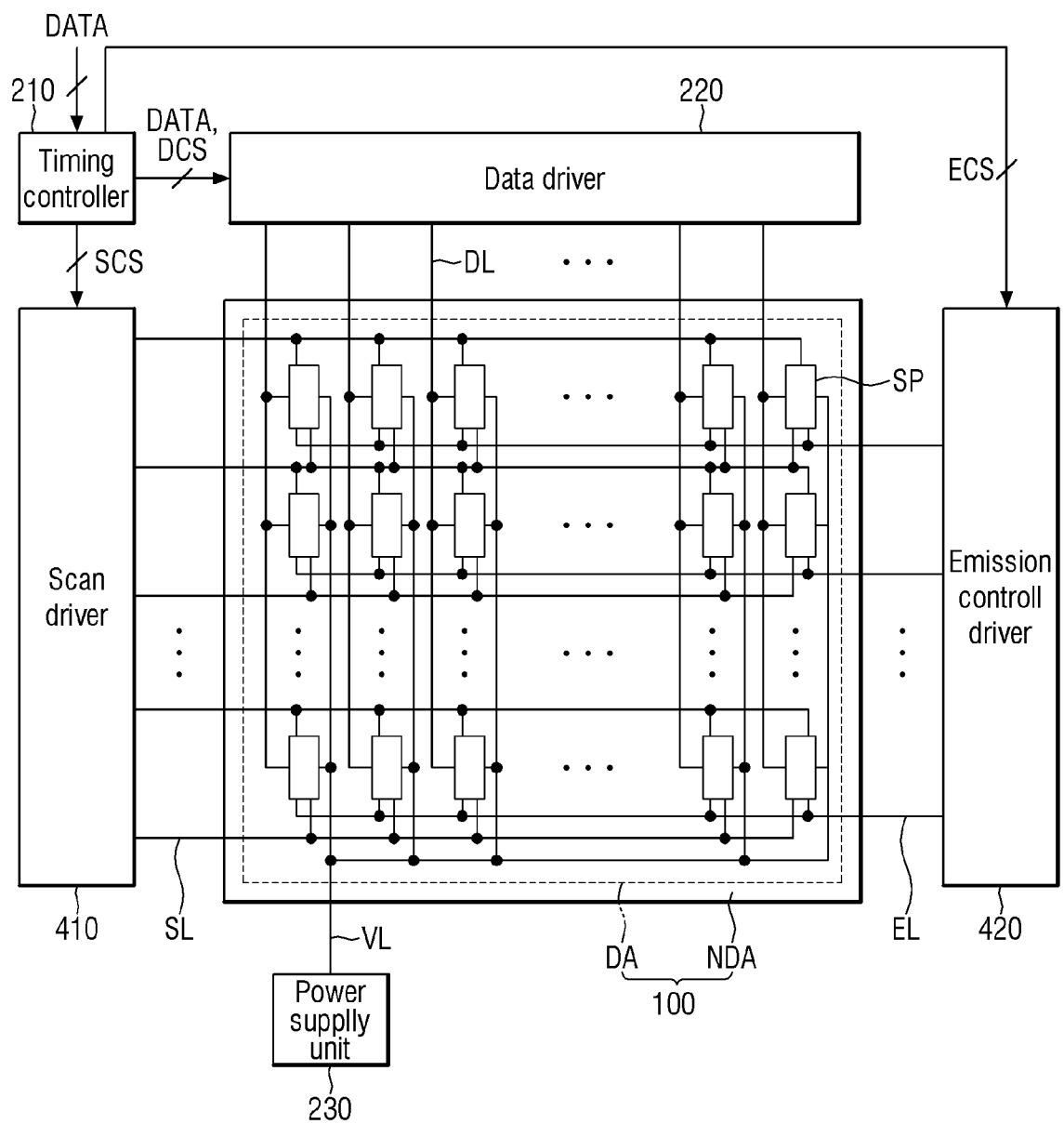
FIG. 3 is a block diagram illustrating the display device according to an embodiment.

FIG. 1 is a perspective view illustrating a display device according to an embodiment, FIG. 2 is a plan view illustrating the display device according to an embodiment, and FIG. 3 is a block diagram illustrating the display device according to an embodiment.

Herein, terms "above," and "top surface" refer to an upward direction based on a display device 10, i.e., a Z-axis direction, and terms "below," and "bottom surface" refer to a downward direction based on the display device 10, i.e., a direction opposite to the Z-axis direction. Further, terms "left," "right," "upper," and "lower" refer to directions when the display device 10 is viewed in a plan view. For example, the term "left" refers to a direction opposite an X-axis direction, the term "right" refers to the X-axis direction, the term "upper" refers to a Y-axis direction, and the term "lower" refers to a direction opposite the Y-axis direction.

Referring to FIGS. 1 to 3, an embodiment of the display device 10 may be a device for displaying a moving image or a still image and may be used as display screens of not only portable electronic devices such as mobile phones, smart phones, tablet personal computers ("PC"s), smart watches, watch phones, mobile communication terminals, laptop computers, electronic-books ("e-books"), portable multimedia players ("PMP"s), navigation devices, ultramobile PCs ("UMPC"s), and the like but also various products such as televisions, monitors, advertising boards, Internet of things ("IOT"s) devices, and the like.

An embodiment of the display device 10 may be a light-emitting display device such as an organic light-emitting display device including an organic light-emitting diode, a quantum dot light-emitting display device including a quantum dot light-emitting layer, an inorganic light-emitting display device including an inorganic semiconductor, and a micro light-emitting display device using a micro light-emitting diode ("mLED"). Hereinafter, for convenience of description, embodiments where the display device 10 is the organic light-emitting display device will be described in detail, but the disclosure is not limited thereto.

In an embodiment, as shown in FIG. 1, the display device 10 includes a display panel 100, a display drive circuit 200, and a circuit board 300.

The display panel 100 may be in a flat surface having a rectangular shape having short sides in a first direction (X-axis direction) and long sides in a second direction (Y-axis direction) intersecting the first direction (X-axis direction). A corner at which the short side in the first direction (X-axis direction) and the long side in the second direction (Y-axis direction) meet may be rounded to have a predetermined curvature or formed at a right angle. A flat surface shape of the display panel 100 is not limited to a quadrangular shape and may be variously modified to have another shape such as a polygonal shape, a circular shape, or an elliptical shape. The display panel 100 may be flat, but the disclosure is not limited thereto. The display panel 100 may include curved portions defined at left and right end portions thereof and having a predetermined curvature or a varied curvature. In an alternative embodiment, the display panel 100 may be flexibly such that the display panel 100 be bent, curved, bent, folded, or rolled.

The display panel 100 may include a display area DA in which sub-pixels SP are disposed to display an image and a non-display area NDA which is a peripheral area of the display area DA. In an embodiment, as shown in FIG. 2, the display area DA may include the sub-pixels SP, scan lines SL connected to the sub-pixels SP, emission control lines EL, data lines DL, and voltage supply lines VL. The scan lines SL and the emission control lines EL may extend in parallel with each other in the first direction (X-axis direction), the data lines DL and the voltage supply lines VL may extend in parallel with each other in the second direction (Y-axis direction) intersecting the first direction (X-axis direction).

Each of the sub-pixels SP may be connected to a corresponding scan line SL, a corresponding data line DL, a corresponding emission control line EL, and a corresponding voltage supply line VL. In an embodiment, as shown in FIG. 2, each of the sub-pixels SP may be connected to two scan lines SL, one data line DL, one emission control line EL, and one voltage supply line VL, but the disclosure is not limited thereto. Alternatively, each of the sub-pixels SP may be connected to three scan lines SL.

Each of the sub-pixels SP may include a driving transistor, a switching transistor, a light-emitting element, and a capacitor. The switching transistor may be turned on when a scan signal is applied from the scan line SL, and thus a data voltage of the data line DL may be applied to a gate electrode of a driving transistor DT (shown in FIG. 4). The driving transistor DT may supply a drive current to the light-emitting element based on the data voltage applied to the gate electrode of the driving transistor DT, and the light-emitting element may emit light having predetermined luminance corresponding to an amount of the drive current. In one embodiment, for example, the driving transistor and the switching transistor may be thin film transistors. The light-emitting element may be an organic light-emitting diode including a first electrode, an organic light-emitting layer, and a second electrode. The capacitor may maintain the data voltage applied to the gate electrode of the driving transistor constant.

The non-display area NDA may be defined as an area from an outer side of the display area DA to an edge of the display panel 100. The non-display area NDA may include a scan driving circuit 400 for applying scan signals to the scan lines SL, fan-out lines FL between the data lines DL and the display drive circuit 200, and pads DP connected to the display drive circuit 200. In one embodiment, for example, the display drive circuit 200 and the pads DP may be disposed at an edge of one side of the display panel 100. The pads DP may be disposed to be closer to the edge of one side of the display panel 100 than the display drive circuit 200.

The scan driving circuit 400 may be connected to the display drive circuit 200 through a plurality of scan control lines SCL. The scan driving circuit 400 may receive a scan control signal SCS and an emission control signal ECS from the display drive circuit 200 through the plurality of scan control lines SCL.

In an embodiment, as shown in FIG. 3, the scan driving circuit 400 may include a scan driver 410 and an emission control driver 420.

The scan driver 410 may generate scan signals based on the scan control signal SCS and sequentially output the scan signals to the scan lines SL. The emission control driver 420 may generate emission signals based on the emission control signal ECS and sequentially output the emission signals to the emission control lines EL.

The scan driving circuit 400 may include a plurality of thin film transistors. The scan driving circuit 400 may be disposed or formed in a same layer as the thin film transistors of the sub-pixels SP. In an embodiment, as shown in FIG. 2, the scan driving circuit 400 may be disposed or formed on one side of the display area DA, e.g., on the non-display area NDA at a left side of the display area DA, but the disclosure is not limited thereto. In one embodiment, for example, the scan driving circuit 400 may be disposed or formed on both sides of the display area DA, e.g., on the non-display areas NDA at left and right sides of the display area DA.

In an embodiment, as shown in FIG. 3, the display drive circuit 200 may include a timing controller 210, a data driver 220, and a power supply unit 230.

The timing controller 210 may receive digital video data DATA and timing signals from the circuit board 300. The timing controller 210 may generate a data control signal DCS for controlling an operation timing of the data driver 220, the scan control signal SCS for controlling an operation timing of the scan driver 410, and the emission control signal ECS for controlling an operation timing of the emission control driver 420 based on the timing signals. The timing controller 210 may supply the digital video data DATA and the data control signal DCS to the data driver 220. The timing controller 210 may supply the scan control signal SCS to the scan driver 410 and the emission control signal ECS to the emission control driver 420 through the plurality of scan control lines SCL.

The data driver 220 may convert the digital video data DATA into analog positive/negative data voltages and supply the analog positive/negative data voltages to the data lines DL through the fan-out lines FL. Scan signals of the scan driving circuit 400 may select sub-pixels SP, to which the data voltages are to be supplied, and the data driver 220 may supply the data voltages to the selected sub-pixels SP.

The power supply unit 230 may generate a first drive voltage to supply the first drive voltage to the voltage supply line VL. The power supply unit 230 may generate a second drive voltage to supply the second drive voltage to a cathode electrode of each light-emitting element of each of the sub-pixels SP. Here, the first drive voltage may be a high potential voltage for driving the light-emitting element, and the second drive voltage may be a low potential voltage for driving the light-emitting element. In one embodiment, for example, the first drive voltage may have a potential that is higher than that of the second drive voltage.

The display drive circuit 200 may be provided or formed as an integrated circuit and disposed on the display panel 100 through a chip-on-glass ("COG") method, a chip-on-plastic ("COP") method, or an ultrasonic bonding method, but the disclosure is not limited thereto. Alternatively, the display drive circuit 200 may be disposed on the circuit board 300. The power supply unit 230 may be disposed on the circuit board 300.

In an embodiment, the circuit board 300 may be bonded on the pads DP using an anisotropic conductive film. In such an embodiment, lead lines of the circuit board 300 may be electrically connected to the pads DP. The circuit board 300 may be a flexible printed circuit board, a printed circuit board, or a flexible film such as a chip on film.

Figure 4:
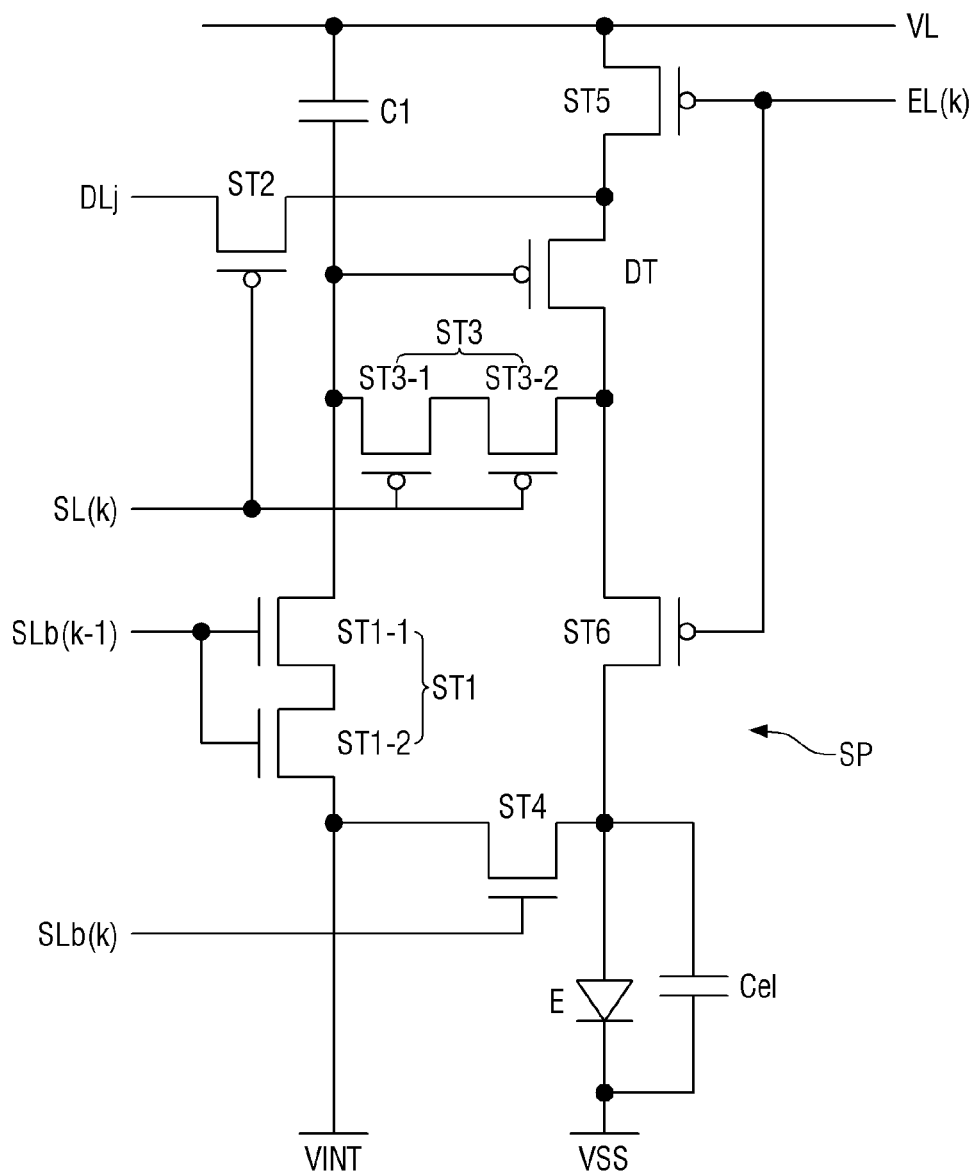
FIG. 4 is a circuit diagram illustrating a sub-pixel according to an embodiment.

FIG. 4 is a circuit diagram illustrating a sub-pixel according to an embodiment.

Referring back to FIG. 3, the sub-pixels SP may be arranged along a plurality of rows and a plurality of columns on the display panel 100. In one embodiment, for example, a sub-pixel SP may be disposed at a $k^{th}$ row and a $j^{th}$ column of the display area DA. In such an embodiment, the sub-pixel SP may be connected to a $(k-1)^{th}$ inverted scan line SLb(k-1) (here, k is a natural number of two or more), a $k^{th}$ inverted scan line SLb(k), a $k^{th}$ scan line SL(k), a $k^{th}$ emission control line EL(k), and a $j^{th}$ data line DLj (here, j is a natural number), as shown in FIG. 4. In such an embodiment, the sub-pixel SP may be connected to a voltage supply line VL for supplying a first drive voltage VDD, an initialization voltage line for supplying an initialization voltage VINT, and a voltage supply line for supplying a second drive voltage VSS.

An embodiment of the sub-pixel SP may include the driving transistor DT, a light-emitting element E, switching elements, and a first capacitor C1. In one embodiment, for example, the switching elements may include first to sixth switching transistors ST1, ST2, ST3, ST4, ST5, and ST6.

In one embodiment, for example, the driving transistor DT and the second, third, fifth, and sixth switching transistors ST2, ST3, ST5, and ST6 may be p-type transistors, and the first and fourth switching transistors ST1 and ST4 may be n-type transistors, as shown in FIG. 4. The p-type transistors may be turned on by a gate low voltage VGL, and the n-type transistors may be turned on by a gate high voltage VGH.

The driving transistor DT may control a source-drain current (Isd) (hereinafter, referred to as a "drive current Isd") based on the data voltage applied to the gate electrode of the driving transistor DT. When a source-gate voltage (Vsg) of the driving transistor DT exceeds a threshold voltage (Vth), the drive current Isd may flow through a channel of the driving transistor DT. In one embodiment, for example, the drive current Isd may be proportional to the square of a difference between the source-gate voltage Vsg and the threshold voltage Vth of the driving transistor DT as expressed in Equation 1 below.

$$Isd=k'\times(Vsg-Vth)^2 \qquad \text{[Equation 1]}$$

In Equation 1, k' denotes a proportional constant determined by a structure and a physical characteristic of the driving transistor DT, Vsg denotes a source-gate voltage of the driving transistor DT, and Vth denotes a threshold voltage of the driving transistor DT.

The light-emitting element E may emit light by receiving the drive current Isd. A light emission amount or luminance of the light-emitting element E may be proportional to an amount of the drive current Isd.

The light-emitting element E may be an organic light-emitting diode including a first electrode, a second electrode, and an organic light-emitting layer disposed between the first electrode and the second electrode. Alternatively, the light-emitting element E may be an inorganic light-emitting element including a first electrode, a second electrode, and an inorganic semiconductor disposed between the first electrode and the second electrode. Alternatively, the light-emitting element E may be a quantum dot light-emitting element including a first electrode, a second electrode, and a quantum dot light-emitting layer disposed between the first electrode and the second electrode. Alternatively, the light-emitting element E may be a micro light-emitting diode. In one embodiment, for example, the first electrode of the light-emitting element E may be an anode electrode and the second electrode thereof may be a cathode electrode, but the disclosure is not limited thereto.

The first electrode or anode electrode of the light-emitting element E may be connected to a second electrode or source electrode of the fourth switching transistor ST4 and a second electrode or drain electrode of the sixth switching transistor ST6. The second electrode or cathode electrode of the light-emitting element E may be connected to the voltage supply line for supplying the second drive voltage VSS. A parasitic capacitance Cel may be formed between the first electrode and the second electrode of the light-emitting element E.

The first switching transistor ST1 may selectively supply the initialization voltage VINT to the gate electrode of the driving transistor DT. In one embodiment, for example, the first switching transistor ST1 may be a dual transistor including a first-first switching transistor ST1-1 and a second first switching transistor ST1-2. The first-first switching transistor ST1-1 and the second first switching transistor ST1-2 may be turned on based on an inverted scan signal of the $(k-1)^{th}$ inverted scan line SLb(k−1) to supply the initialization voltage VINT to the gate electrode of the driving transistor DT. The gate electrode of the driving transistor DT may be discharged by receiving the initialization voltage VINT. A gate electrode of the first-first switching transistor ST1-1 may be connected to the $(k-1)^{th}$ inverted scan line SLb(k−1). A first electrode of the first-first switching transistor ST1-1 may be connected to the gate electrode of the driving transistor DT, and a second electrode thereof may be connected to a first electrode of the second first switching transistor ST1-2. A gate electrode of the second first switching transistor ST1-2 may be connected to the $(k-1)^{th}$ inverted scan line SLb(k−1), the first electrode thereof may be connected to the second electrode of the first-first switching transistor ST1-1, and a second electrode thereof may be connected to the initialization voltage line for supplying the initialization voltage VINT. In one embodiment, for example, the first electrode of the first switching transistor ST1 may be a drain electrode, and the second electrode thereof may be a source electrode.

The second switching transistor ST2 may selectively supply the data voltage to a first electrode of the driving transistor DT. The second switching transistor ST2 may be turned on based on a scan signal of the $k^{th}$ scan line SL(k) to supply the data voltage to the first electrode of the driving transistor DT. A gate electrode of the second switching transistor ST2 may be connected to the $k^{th}$ scan line SL(k), a first electrode thereof may be connected to the $j^{th}$ data line DLj, and a second electrode thereof may be connected to the first electrode of the driving transistor DT. In one embodiment, for example, the first electrode of the second switching transistor ST2 may be a source electrode, and the second electrode thereof may be a drain electrode.

The third switching transistor ST3 may selectively connect a second electrode of the driving transistor DT to the gate electrode thereof. In one embodiment, for example, the third switching transistor ST3 may be a dual transistor including a first third switching transistor ST3-1 and a second third switching transistor ST3-2. The first third switching transistor ST3-1 and the second third switching transistor ST3-2 may be turned on based on the scan signal of the $k^{th}$ scan line SL(k) to connect the second electrode of the driving transistor DT to the gate electrode thereof. That is, when the first third switching transistor ST3-1 and the second third switching transistor ST3-2 are turned on, the gate electrode and the second electrode of the driving transistor DT are connected such that the driving transistor DT may be driven as a diode. A gate electrode of the first third switching transistor ST3-1 may be connected to the $k^{th}$ scan line SL(k), a first electrode thereof may be connected to a second electrode of the second third switching transistor ST3-2, and a second electrode thereof may be connected to the drain electrode of the driving transistor DT. A gate electrode of the second third switching transistor ST3-2 may be connected to the $k^{th}$ scan line SL(k), a first electrode thereof may be connected to the second electrode of the driving transistor DT, and the second electrode thereof may be connected to the first electrode of the first third switching transistor ST3-1. In one embodiment, for example, the first electrode of the third switching transistor ST3 may be a source electrode, and the second electrode thereof may be a drain electrode.

The fourth switching transistor ST4 may selectively supply the initialization voltage VINT to the first electrode of the light-emitting element E. The fourth switching transistor ST4 may be turned on based on an inverted scan signal of a $k^{th}$ inverted scan line SLb(k) to supply the initialization voltage VINT to the first electrode of the light-emitting element E. The first electrode of the light-emitting element E may receive the initialization voltage VINT so that the light-emitting element E may be discharged. A gate electrode of the fourth switching transistor ST4 may be connected to the $k^{th}$ inverted scan line SLb(k), a first electrode thereof may be connected to the first electrode of the light-emitting element E, and a second electrode thereof may be connected to the initialization voltage line for supplying the initialization voltage VINT. In one embodiment, for example, the first electrode of the fourth switching transistor ST4 may be a drain electrode, and the second electrode thereof may be a source electrode.

The fifth switching transistor ST5 may selectively supply the first drive voltage VDD to the first electrode of the driving transistor DT. The fifth switching transistor ST5 may be turned on based on an emission signal of the $k^{th}$ emission control line EL(k) to supply the first drive voltage VDD to the first electrode of the driving transistor DT. A gate electrode of the fifth switching transistor ST5 may be connected to the $k^{th}$ emission control line EL(k), a first electrode thereof may be connected to the voltage supply line VL for supplying the first drive voltage VDD, and a second electrode thereof may be connected to the first electrode of the driving transistor DT. In one embodiment, for example, the first electrode of the fifth switching transistor ST5 may be a source electrode, and the second electrode thereof may be a drain electrode.

The sixth switching transistor ST6 may selectively connect the second electrode of the driving transistor DT to the first electrode of the light-emitting element E. The sixth switching transistor ST6 may be turned on based on the emission signal of the $k^{th}$ emission control line EL(k) to connect the second electrode of the driving transistor DT to the first electrode of the light-emitting element E. A gate electrode of the sixth switching transistor ST6 may be connected to the $k^{th}$ emission control line EL(k), a first electrode thereof may be connected to the second electrode of the driving transistor DT, and a second electrode thereof may be connected to the first electrode of the light-emitting element E. In one embodiment, for example, the first electrode of the sixth switching transistor ST6 may be a source electrode, and the second electrode thereof may be a drain electrode. When both the fifth switching transistor ST5 and the sixth switching transistor ST6 are turned on, the drive current Isd may be supplied to the light-emitting element E.

The first and fourth switching transistors ST1 and ST4 may be a different type from the driving transistor DT and the second, third, fifth, and sixth switching transistors ST2, ST3, ST5, and ST6. In one embodiment, for example, the first and fourth switching transistors ST1 and ST4 may be n-type transistors such that transfer efficiency of the initialization voltage VINT or the low potential voltage may be improved. In such an embodiment, the driving transistor DT and the second, third, fifth, and sixth switching transistors ST2, ST3, ST5, and ST6 are p-type transistors such that transfer efficiency of the drive voltage, the data voltage, or the high potential voltage may be improved. Thus, the sub-pixel SP includes the first and fourth switching transistors ST1 and ST4 which are turned on based on the inverted scan signal and the second, third, fifth, and sixth switching transistors ST2, ST3, ST5, and ST6 which are turned on based on the scan signal or the emission signal such that voltage transfer efficiency of a pixel circuit may be improved.

The first capacitor C1 may be connected between the gate electrode of the driving transistor DT and the voltage supply line VL. One electrode of the first capacitor C1 is connected to the voltage supply line VL, and the other electrode thereof is connected to the gate electrode of the driving transistor DT such that a potential difference between the voltage supply line VL and the gate electrode of the driving transistor DT may be maintained.

An active layer of each of the first to sixth switching transistors ST1, ST2, ST3, ST4, ST5, and ST6 and the driving transistor DT may include or be formed of at least one material selected from a polysilicon, an amorphous silicon ("a-Si"), and an oxide semiconductor. In one embodiment, for example, the active layer of each of the first to sixth switching transistors ST1, ST2, ST3, ST4, ST5, and ST6 and the driving transistor DT may be formed through a low temperature polysilicon ("LTPS") process using a polysilicon, but the disclosure is not limited thereto.

Figure 5:
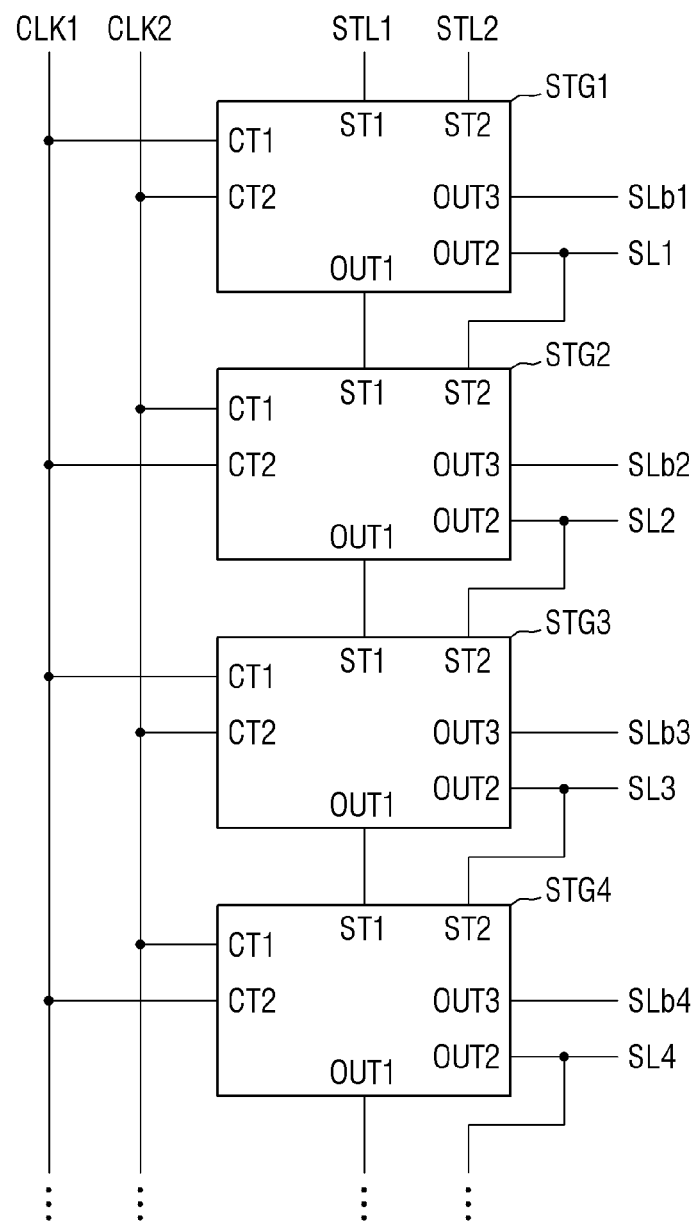
FIG. 5 is a block diagram illustrating a scan driver according to an embodiment.

FIG. 5 is a block diagram illustrating a scan driver according to an embodiment.

Referring to FIG. 5, an embodiment of the scan driver 410 may include a plurality of stages STG1 to STG4. Hereinafter, for convenience of illustration and description, only the first to fourth stages STG1 to STG4 connected to first to fourth scan lines SL1 to SL4 and first to fourth inverted scan lines SLb1 to SLb4 are shown in FIG. 5. Since configurations of fifth to $i^{th}$ stages STG5 to STGi (i is a natural number of six or greater) of the scan driver 410 may be substantially the same as those of the first to fourth stages STG1 to STG4, any repetitive detailed description thereof will be omitted herein.

Each of the plurality of stages STG1 to STG4 may include first and second clock terminals CT1 and CT2, first and second start terminals ST1 and ST2, and first to third output terminals OUT1, OUT2, and OUT3.

A $(2n-1)^{th}$ stage STG(2n-1) may receive a first clock signal CLK1 through a first clock terminal CT1 and receive a second clock signal CLK2 through a second clock terminal CT2. Here, the first and second clock signals CLK1 and CLK2 may have a same pulse width and pluses thereof may not overlap each other.

A $2n^{th}$ stage STG(2n) may receive the second clock signal CLK2 through a first clock terminal CT1 and receive the first clock signal CLK1 through a second clock terminal CT2. Accordingly, each of the plurality of stages STG1 to STG4 alternately receives the first clock signal CLK1 and the second clock signal CLK2 through the first and second clock terminals CT1 and CT2, thereby sequentially outputting the scan signal and the inverted scan signal to each sub-pixel arranged in each row.

The first stage STG1 may be connected to a first start signal line STL1 through a first start terminal ST1 and connected to a second start signal line STL2 through a second start terminal ST2. The first start terminal ST1 of the first stage STG1 may receive a first start signal from the first start signal line STL1, and the second start terminal ST2 may receive a second start signal from the second start signal line STL2.

A first start terminal ST1 of the second stage STG2 may be connected to a first output terminal OUT1 of the first stage STG1, and a second start terminal ST2 of the second stage STG2 may be connected to a second output terminal OUT2 of the first stage STG1. Thus, the first start terminal ST1 of the second stage STG2 may receive a carry signal of the first stage STG1, and the second start terminal ST2 of the second stage STG2 may receive a first scan signal of the first stage STG1.

In such an embodiment, the first start terminals ST1 of the third to $2n^{th}$ stages STG3 to STG(2n) may be respectively connected to the first output terminals OUT1 of the second to $(2n-1)^{th}$ stages STG2 to STG(2n-1), and the second start terminals ST2 of the third to $2n^{th}$ stages STG3 to STG(2n) may be respectively connected to the second output terminals OUT2 of the second to $(2n-1)^{th}$ stages STG2 to STG(2n-1). Consequently, the first start terminals ST1 of the third to $2n^{th}$ stages STG3 to STG(2n) may respectively receive carry signals of the second to $(2n-1)^{th}$ stages STG2 to STG(2n-1), and the second start terminals ST2 of the third to $2n^{th}$ stages STG3 to STG(2n) may respectively receive first scan signals of the second to $(2n-1)^{th}$ stages STG2 to STG(2n-1).

The first output terminal OUT1 of each of the plurality of stages STG1 to STG4 may be connected to the first start terminal ST1 of the next stage. Thus, each of the plurality of stages STG1 to STG4 may supply the carry signal to the first start terminal ST1 of the next stage through the first output terminal OUT1 of each of the plurality of stages STG1 to STG4. Therefore, the carry signal of each of the plurality of stages STG1 to STG4 may serve as a first start signal of the next stage.

Each of the second output terminals OUT2 of the plurality of stages STG1 to STG4 may be connected to a corresponding one of the plurality of scan lines SL1 to SL4 and the second start terminals ST2 of the next stages. In one embodiment, for example, the second output terminal OUT2 of the first stage STG1 may supply the first scan signal to the second start terminal ST2 of the second stage STG2 while supplying the first scan signal to the plurality of pixels through the first scan line SL1. Therefore, the first scan signal of the first stage STG1 may serve as a second start signal of the second stage STG2.

Each of the third output terminals OUT3 of the plurality of stages STG1 to STG4 may be connected to a corresponding one of the plurality of inverted scan lines SLb1 to SLb4. Each of the stages STG1 to STG4 may supply an inverted scan signal to one of the plurality of pixels through the inverted scan lines SLb1 to SLb4.

Figure 6:
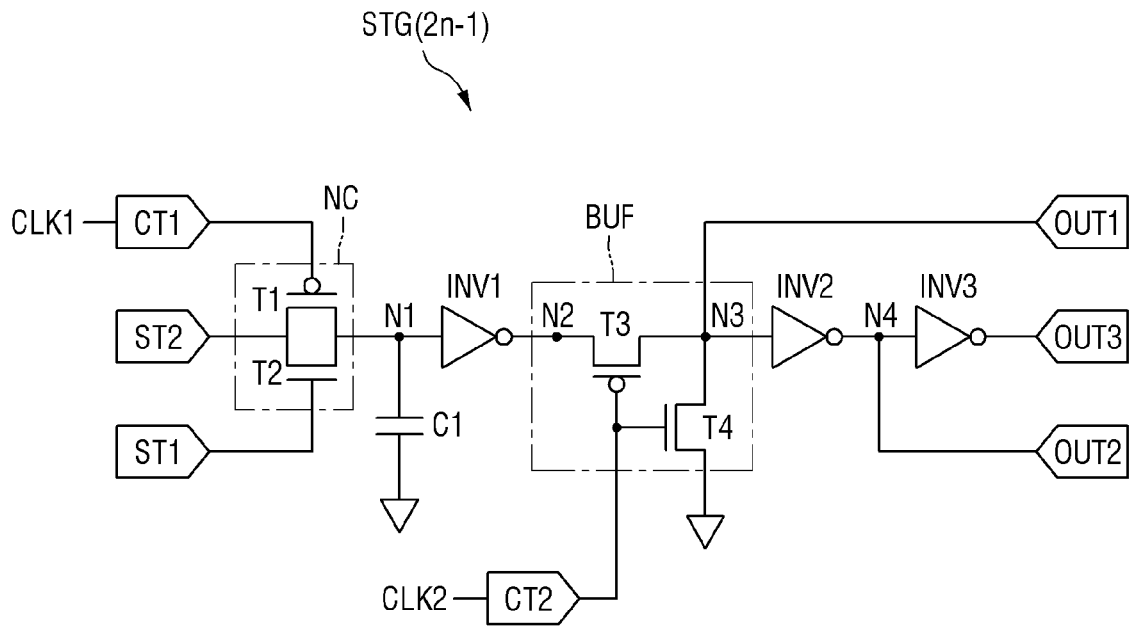
FIG. 6 is a diagram illustrating a $(2n-1)^{th}$ stage of the scan driver according to an embodiment.
Figure 7:
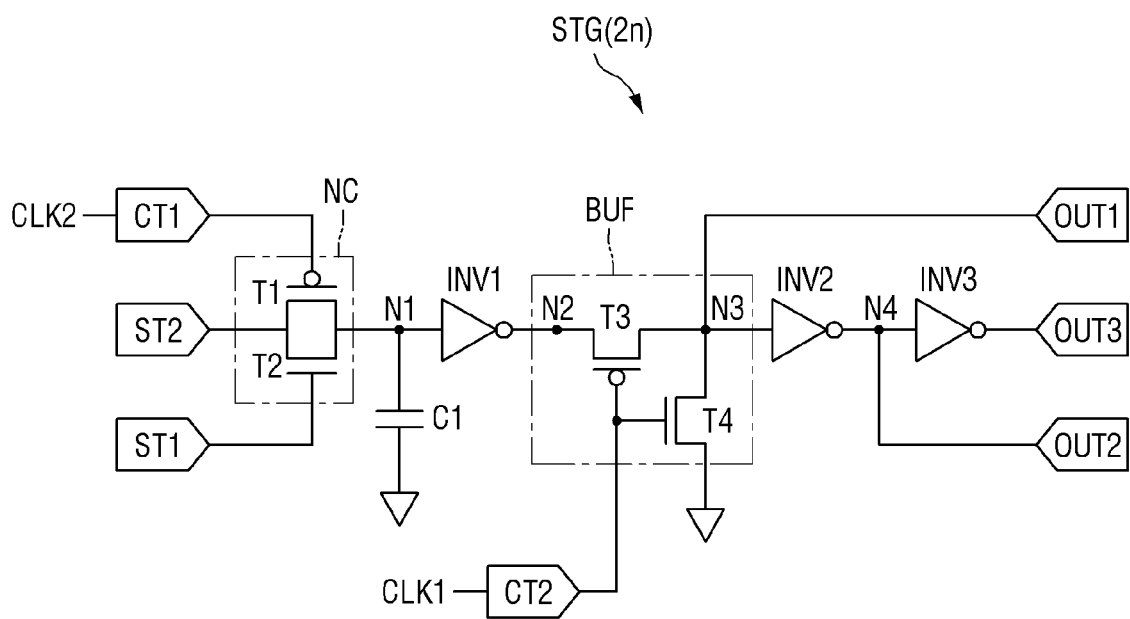
FIG. 7 is a diagram illustrating a $2n^{th}$ stage of the scan driver according to an embodiment.
Figure 8:
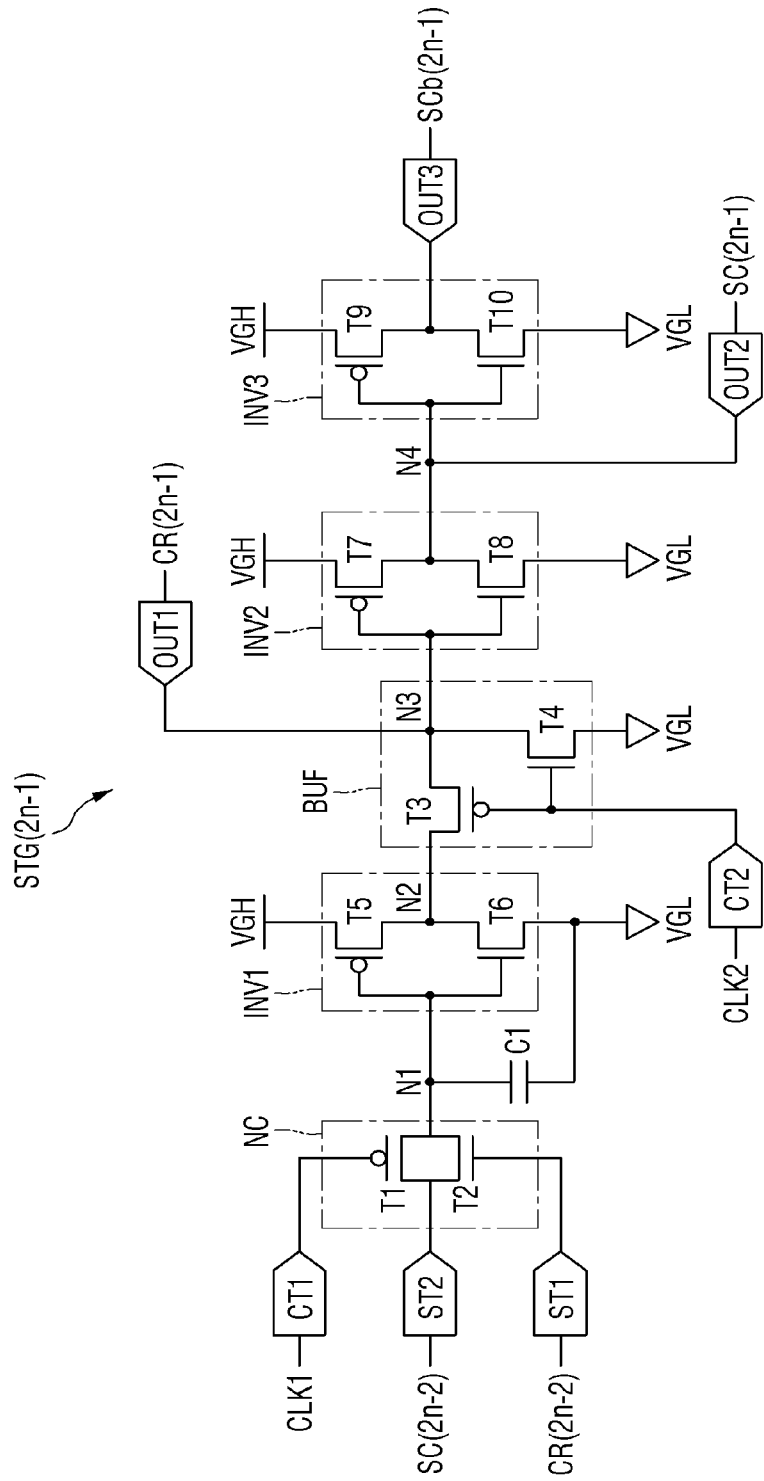
FIG. 8 is a circuit diagram illustrating an embodiment of the $(2n-1)^{th}$ stage of FIG. 6.
Figure 9:
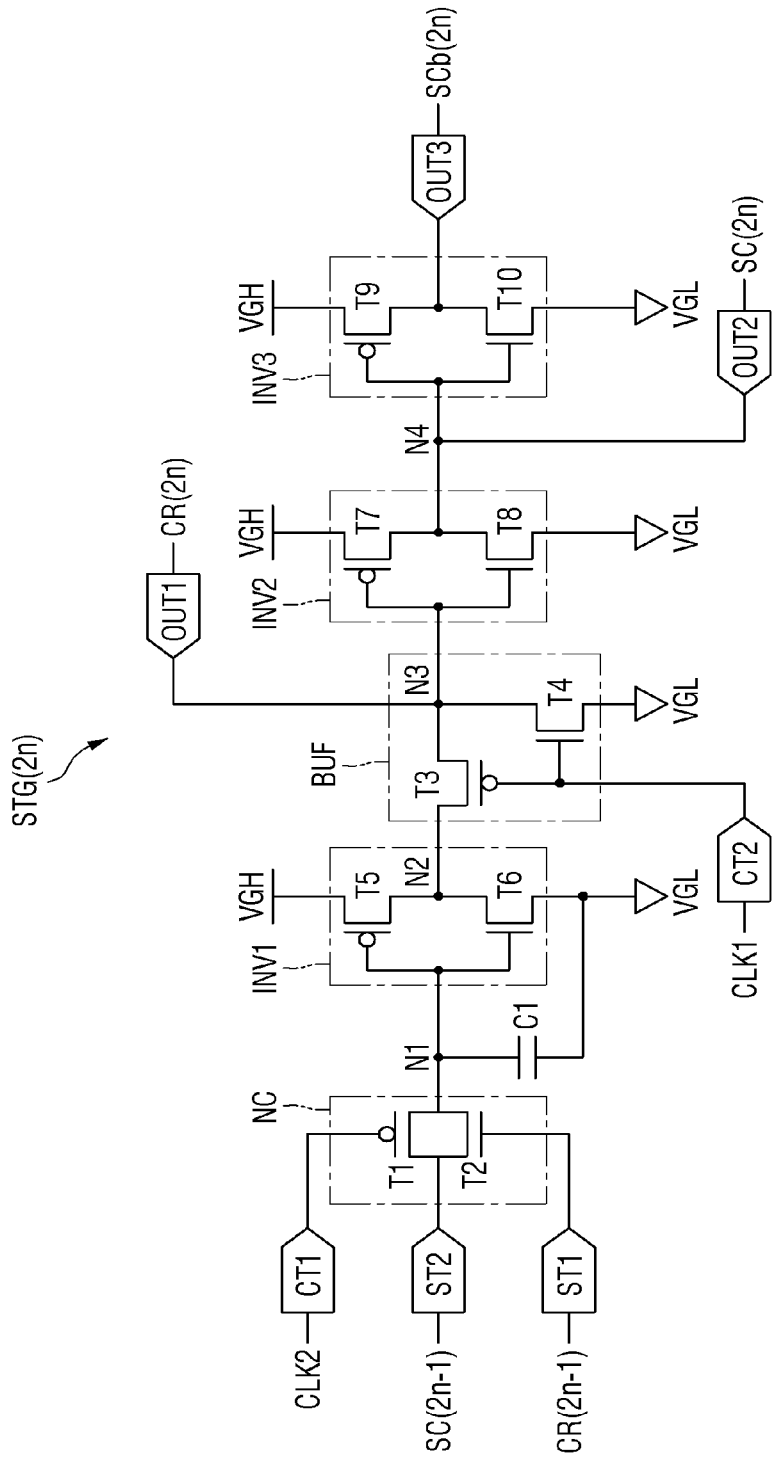
FIG. 9 is a circuit diagram illustrating an embodiment of the $2n^{th}$ stage of FIG. 7.

FIG. 6 is a diagram illustrating the $(2n-1)^{th}$ stage of the scan driver according to an embodiment, and FIG. 7 is a diagram illustrating the $2n^{th}$ stage of the scan driver according to an embodiment. FIG. 8 is a circuit diagram illustrating an embodiment of the $(2n-1)^{th}$ stage of FIG. 6, and FIG. 9 is a circuit diagram illustrating an embodiment of the $2n^{th}$ stage of FIG. 7.

Referring to FIGS. 6 to 9, the $(2n-1)^{th}$ stage STG(2n-1) (hereinafter, n is a natural number) may be an odd-numbered stage connected to a $(2n-1)^{th}$ scan line and a $(2n-1)^{th}$ inverted scan line, and the $2n^{th}$ stage STG(2n) may be an even-numbered stage connected to a $2n^{th}$ scan line and a $2n^{th}$ inverted scan line.

In an embodiment, as shown in FIGS. 6 and 8, the $(2n-1)^{th}$ stage STG(2n-1) may receive the first clock signal CLK1 through the first clock terminal CT1 and receive the second clock signal CLK2 through the second clock terminal CT2. In an embodiment, as shown in FIGS. 7 and 9, the $2n^{th}$ stage STG(2n) may receive the second clock signal CLK2 through the first clock terminal CT1 and receive the first clock signal CLK1 through the second clock terminal CT2. Accordingly, each of the plurality of stages STG1 to STG(2n) alternately receives the first clock signal CLK1 and the second clock signal CLK2 through the first and second clock terminals CT1 and CT2, thereby sequentially outputting the scan signal and the inverted scan signal to each sub-pixel arranged in a corresponding row.

The $(2n-1)^{th}$ stage STG(2n-1) and the $2n^{th}$ stage STG(2n) may operate in a same manner as each other except for a difference between the first and second clock signals CLK1 and CLK2. Hereinafter, for convenience of description, one stage of the $(2n-1)^{th}$ stage STG(2n-1) (for example, a $k^{th}$ stage) will be described in detail, and any repetitive detailed description of the $2n^{th}$ stage STG(2n) will be omitted or simplified. Herein, k may be 2n or 2n-1.

In an embodiment, a $k^{th}$ stage STG(k) may include a node controller NC, a first inverter INV1, a buffer BUF, a second inverter INV2, and a third inverter INV3.

The node controller NC of the $k^{th}$ stage STG(k) may supply a second output signal SC(k-1) of a previous stage STG(k-1) to a first node N1 based on an input signal CLK1 of a first clock terminal CT1 or a first output signal CR(k-1) of the previous stage STG(k-1). Here, a first output signal of a $(k-1)^{th}$ stage STG(k-1) may correspond to a carry signal CR(k-1) supplied to a first start terminal ST1 of the $k^{th}$ stage STG(k). A second output signal of the $(k-1)^{th}$ stage STG(k-1) may correspond to a scan signal SC(k-1) supplied to a second start terminal ST2 of the $k^{th}$ stage STG(k).

In one embodiment, for example, the node controller NC may include a first transistor T1 and a second transistor T2, as shown in FIGS. 8 and 9.

A gate electrode of the first transistor T1 may receive a first clock signal CLK1 from the first clock terminal CT1. When the first clock signal CLK1 has a gate low voltage VGL, the first transistor T1 may supply the second output signal SC(k-1) of the previous stage STG(k-1) to the first node N1. The gate electrode of the first transistor T1 may be connected to the first clock terminal CT1 of the $k^{th}$ stage STG(k), a first electrode thereof may be connected to the second start terminal ST2 of the $k^{th}$ stage STG(k), and a second electrode thereof may be connected to the first node N1.

A gate electrode of the second transistor T2 may receive the first output signal CR(k-1) of the previous stage STG (k-1) from a first start terminal ST1 of the $k^{th}$ stage STG(k). When the carry signal CR(k-1) of the previous stage STG (k-1) has a gate high voltage VGH, the second transistor T2 may supply the second output signal SC(k-1) of the previous stage STG(k-1) to the first node N1. The gate electrode of the second transistor T2 may be connected to the first start terminal ST1 of the $k^{th}$ stage STG(k), a first electrode thereof may be connected to the second start terminal ST2 of the $k^{th}$ stage STG(k), and a second electrode thereof may be connected to the first node N1.

Thus, when at least one of the first and second transistors T1 and T2 is turned on, the node controller NC may supply the second output signal SC(k-1) of the previous stage STG(k-1) to the first node N1. In one embodiment, for example, the node controller NC may include a p-type first transistor T1 and an n-type second transistor T2. The p-type first transistor T1 may have relatively high transfer efficiency of the carry signal CR(k-1) of a high level, and the n-type second transistor T2 may have relatively high transfer efficiency of the carry signal CR(k-1) of a low level. Consequently, the node controller NC includes the first and second transistors T1 and T2 of different types, thereby improving the transfer efficiency of the carry signal CR(k-1) supplied to the first node N1.

The first inverter INV1 may be connected between the first node N1 and a second node N2. The first inverter INV1 may invert a voltage of the first node N1 to supply the inverted voltage to the second node N2.

In one embodiment, for example, the first inverter INV1 may include a fifth transistor T5 and a sixth transistor T6, as shown in FIGS. 8 and 9.

The fifth transistor T5 may supply a gate high voltage VGH to the second node N2 based on the voltage of the first node N1. When the first node N1 has a gate low voltage VGL, the fifth transistor T5 may supply the gate high voltage VGH to the second node N2. A gate electrode of the fifth transistor T5 may be connected to the first node N1, a first electrode thereof may be connected to a gate high voltage line for supplying the gate high voltage VGH, and a second electrode thereof may be connected to the second node N2.

The sixth transistor T6 may supply the gate low voltage VGL to the second node N2 based on the voltage of the first node N1. When the first node N1 has the gate high voltage VGH, the sixth transistor T6 may discharge the second node N2. A gate electrode of the sixth transistor T6 may be connected to the first node N1, a first electrode thereof may be connected to the second node N2, and a second electrode thereof may be connected to a gate low voltage line for supplying a gate low voltage VGL.

In one embodiment, for example, the first inverter INV1 may include a p-type fifth transistor T5 and an n-type sixth transistor T6. The p-type fifth transistor T5 and the n-type sixth transistor T6 may constitute a complementary metal oxide semiconductor ("CMOS") circuit. While the fifth transistor T5 charges the second node N2 and the sixth transistor T6 discharges the second node N2, a gate-source voltage (Vgs) of the sixth transistor T6 may correspond to a difference voltage between the gate high voltage VGH and the gate low voltage VGL.

If the second node N2 is charged or discharged using two p-type transistors or two n-type transistors, a voltage loss corresponding to a threshold voltage (Vth) of a transistor may occur in a source-gate voltage (Vsg) or a gate-source voltage (Vgs) of the transistor which discharges the second node N2. Thus, current driving capability of the two p-type transistors or the two n-type transistors may be relatively degraded.

In an embodiment, the first inverter INV1 of the $k^{th}$ stage STG(k) of the scan driver 410 includes the fifth and sixth transistors T5 and T6 constituting the CMOS circuit, thereby relatively improving the current driving capability. In such an embodiment, even when a relatively low drive voltage or a relatively low gate high voltage is applied to the $k^{th}$ stage STG(k) of the scan driver 410, the first inverter INV1 may invert the voltage of the first node N1 to supply the inverted voltage to the second node N2 without a voltage loss. The first inverter INV1 may include the fifth and sixth transistors T5 and T6 constituting the CMOS circuit, thereby reducing power consumption and a circuit area and improving reliability of the display device 10.

The $k^{th}$ stage STG(k) may further include a capacitor C1 connected between the first node N1 and the gate low voltage line. The capacitor C1 may form predetermined capacitance between the first node N1 and the gate low voltage line, thereby stably maintaining the voltage of the first node N1. In one embodiment, for example, one electrode of the capacitor C1 may be connected to the first node N1, and the other electrode thereof may be connected to the gate low voltage line for supplying the gate low voltage VGL.

When a stage includes a pull-up transistor, which is turned on due to a voltage of a pull-up node to output a clock signal to an output terminal, and a capacitor connected between the output terminal and the pull-up node, bootstrapping may occur to increase a gate-source voltage and a drain-source voltage of the pull-up transistor.

In an embodiment, the $k^{th}$ stage STG(k) of the scan driver 410 includes the capacitor C1 connected between the first node N1 and the gate low voltage line, thereby stably maintaining the voltage of the first node N1 without using bootstrapping. The k$^{th}$ stage STG(k) of the scan driver 410 may output a scan signal SC(k) and an inverted scan signal SCb(k) without bootstrapping, thereby preventing gate-source voltages and drain-source voltages of transistors connected to the output terminal from being increased and improving reliability of the scan driver 410.

The buffer BUF may supply a voltage of the second node N2 to the first output terminal OUT1 based on an input signal of the second clock terminal CT2. In such an embodiment, the first output terminal OUT1 of the k$^{th}$ stage STG(k) may be connected to a third node N3 connected between the buffer BUF and the second inverter INV2. The buffer BUF of the k$^{th}$ stage STG(k) may output a carry signal CR(k) through the first output terminal OUT1. The carry signal CR(k) of the k$^{th}$ stage STG(k) may be transferred to a first start terminal ST1 of a (k+1)$^{th}$ stage STG(k+1) to serve as a first start signal.

In one embodiment, for example, the buffer BUF may include a third transistor T3 and a fourth transistor T4.

A gate electrode of the third transistor T3 may receive a second clock signal CLK2 from the second clock terminal CT2. When the second clock signal CLK2 has a gate low voltage, the third transistor T3 may supply the voltage of the second node N2 to the first output terminal OUT1. The gate electrode of the third transistor T3 may be connected to a second clock terminal CT2 of the k$^{th}$ stage STG(k), a first electrode thereof may be connected to the second node N2, and a second electrode thereof may be connected to the first output terminal OUT1.

A gate electrode of the fourth transistor T4 may receive the second clock signal CLK2 from the second clock terminal CT2. The fourth transistor T4 may supply the gate low voltage VGL to the third node N3 based on the second clock signal CLK2. When the second clock signal CLK2 has a gate high voltage, the fourth transistor T4 may discharge the third node N3. The gate electrode of the fourth transistor T4 may be connected to the second clock terminal CT2 of the k$^{th}$ stage STG(k), a first electrode thereof may be connected to the first output terminal OUT1, and a second electrode thereof may be connected to the gate low voltage line for supplying the gate low voltage VGL.

In one embodiment, for example, the buffer BUF may include a p-type third transistor T3 and an n-type fourth transistor T4. The p-type third transistor T3 may have relatively high transfer efficiency of a high level voltage of the second node N2, and the n-type fourth transistor T4 may have relatively high transfer efficiency of the gate low voltage VGL. Consequently, the buffer BUF includes the third and fourth transistors T3 and T4 of different types, thereby reducing an area and the number of transistors serving as a buffer and reducing power consumption and a circuit area.

The second inverter INV2 may be connected between the first output terminal OUT1 and a second output terminal OUT2. The second inverter INV2 may invert a voltage of the first output terminal OUT1 to supply the inverted voltage to the second output terminal OUT2. Here, the first output terminal OUT1 of the k$^{th}$ stage STG(k) may be connected to the third node N3, and the second output terminal OUT2 thereof may be connected to a fourth node N4. The second inverter INV2 of the k$^{th}$ stage STG(k) may output a scan signal SC(k) through the second output terminal OUT2. The scan signal SC(k) of the k$^{th}$ stage STG(k) may be transferred to a second start terminal ST2 of the (k+1)$^{th}$ stage STG(k+1) to serve as a second start signal.

The scan signal SC(k) of the k$^{th}$ stage STG(k) may be supplied to pixels arranged in a k$^{th}$ row. In an embodiment, as shown in FIG. 4, second and third switching transistors ST2 and ST3 of the pixels arranged in the k$^{th}$ row may be turned on based on the scan signal SC(k) of the k$^{th}$ stage STG(k).

In one embodiment, for example, the second inverter INV2 may include a seventh transistor T7 and an eighth transistor T8.

The seventh transistor T7 may supply the gate high voltage VGH to the fourth node N4 based on the voltage of the third node N3. When the third node N3 has the gate low voltage VGL, the seventh transistor T7 may supply the gate high voltage VGH to the fourth node N4. A gate electrode of the seventh transistor T7 may be connected to the third node N3, a first electrode thereof may be connected to the gate high voltage line for supplying the gate high voltage VGH, and a second electrode thereof may be connected to the fourth node N4.

The eighth transistor T8 may supply the gate low voltage VGL to the fourth node N4 based on the voltage of the third node N3. When the third node N3 has the gate high voltage VGH, the eighth transistor T8 may discharge the fourth node N4. A gate electrode of the eighth transistor T8 may be connected to the third node N3, a first electrode thereof may be connected to the fourth node N4, and a second electrode thereof may be connected to the gate low voltage line for supplying the gate low voltage VGL.

In one embodiment, for example, the second inverter INV2 may include a p-type seventh transistor T7 and an n-type eighth transistor T8. The p-type seventh transistor T7 and the n-type eighth transistor T8 may constitute a CMOS circuit. While the seventh transistor T7 charges the fourth node N4 and the eighth transistor T8 discharges the fourth node N4, a gate-source voltage (Vgs) of the eighth transistor T8 may correspond to a difference voltage between the gate high voltage VGH and the gate low voltage VGL.

When the fourth node N4 is charged or discharged using two p-type transistors or two n-type transistors, a voltage loss corresponding to a threshold voltage Vth of a transistor may occur in a source-gate voltage Vsg or a gate-source voltage Vgs of the transistor which discharges the fourth node N4. Thus, current driving capability of the two p-type transistors or the two n-type transistors may be relatively degraded.

Therefore, the second inverter INV2 of the k$^{th}$ stage STG(k) of the scan driver 410 includes the seventh and eighth transistors T7 and T8 constituting the CMOS circuit, thereby relatively improving the current driving capability. Even when a relatively low drive voltage or a relatively low gate high voltage is applied to the k$^{th}$ stage STG(k) of the scan driver 410, the second inverter INV2 may invert the voltage of the third node N3 to supply the inverted voltage to the fourth node N4 without a voltage loss. The second inverter INV2 includes the seventh and eighth transistors T7 and T8 constituting the CMOS circuit, thereby reducing power consumption and a circuit area and improving reliability of the display device 10.

The third inverter INV3 may be connected between the second output terminal OUT2 and a third output terminal OUT3. The third inverter INV3 may invert a voltage of the second output terminal OUT2 to supply the inverted voltage to the third output terminal OUT3. Here, the second output terminal OUT2 of the k$^{th}$ stage STG(k) may be connected to the fourth node N4. The third inverter INV3 of the k$^{th}$ stage STG(k) may output an inverted scan signal SCb(k) through the third output terminal OUT3.

The inverted scan signal SCb(k−1) of the (k−1)$^{th}$ stage STG(k−1) may be supplied to the pixels arranged in the k$^{th}$ row. In an embodiment, as shown in FIG. 4, first switching transistors ST1 of the pixels arranged in the k$^{th}$ row may be turned on based on the inverted scan signal SCb(k−1) of the (k−1)$^{th}$ stage STG(k−1).

The inverted scan signal SCb(k) of the k$^{th}$ stage STG(k) may be supplied to the pixels arranged in the k$^{th}$ row. In an embodiment, as shown in FIG. 4, fourth switching transistors ST4 of the pixels arranged in the k$^{th}$ row may be turned on based on the inverted scan signal SCb(k) of the k$^{th}$ stage STG(k).

In one embodiment, for example, the third inverter INV3 may include a ninth transistor T9 and a tenth transistor T10.

The ninth transistor T9 may supply the gate high voltage VGH to the third output terminal OUT3 based on the voltage of the fourth node N4. When the fourth node N4 has the gate low voltage VGL, the ninth transistor T9 may supply the gate high voltage VGH to the third output terminal OUT3. A gate electrode of the ninth transistor T9 may be connected to the fourth node N4, a first electrode thereof may be connected to the gate high voltage line for supplying the gate high voltage VGH, and a second electrode thereof may be connected to the third output terminal OUT3.

The tenth transistor T10 may supply the gate low voltage VGL to the third output terminal OUT3 based on the voltage of the fourth node N4. When the fourth node N4 has the gate high voltage VGH, the tenth transistor T10 may discharge the third output terminal OUT3. A gate electrode of the tenth transistor T10 may be connected to the fourth node N4, a first electrode thereof may be connected to the third output terminal OUT3, and a second electrode thereof may be connected to the gate low voltage line for supplying the gate low voltage VGL.

In one embodiment, for example, the third inverter INV3 may include a p-type ninth transistor T9 and an n-type tenth transistor T10. The p-type ninth transistor T9 and the n-type tenth transistor T10 may constitute a CMOS circuit. While the ninth transistor T9 charges the third output terminal OUT3 and the tenth transistor T10 thereof discharges the third output terminal OUT3, a gate-source voltage (Vgs) of the tenth transistor T10 may correspond to a difference voltage between the gate high voltage VGH and the gate low voltage VGL.

When the third output terminal OUT3 is charged or discharged using two p-type transistors or two n-type transistors, a voltage loss corresponding to a threshold voltage (Vth) of a transistor may occur in a source-gate voltage (Vsg) or a gate-source voltage (Vgs) of the transistor which discharges the third output terminal OUT3. Thus, current driving capability of the two p-type transistors or the two n-type transistors may be relatively degraded.

Therefore, the third inverter INV3 of the k$^{th}$ stage STG(k) of the scan driver 410 includes the ninth and tenth transistors T9 and T10 constituting the CMOS circuit, thereby relatively improving the current driving capability. Even when a relatively low drive voltage or a relatively low gate high voltage is applied to the k$^{th}$ stage STG(k) of the scan driver 410, the third inverter INV3 may invert the voltage of the fourth node N4 to supply the inverted voltage to the third output terminal OUT3 without a voltage loss. The third inverter INV3 includes the ninth and tenth transistors T9 and T10 constituting the CMOS circuit, thereby reducing power consumption and a circuit area and improving reliability of the display device 10.

Figure 10:
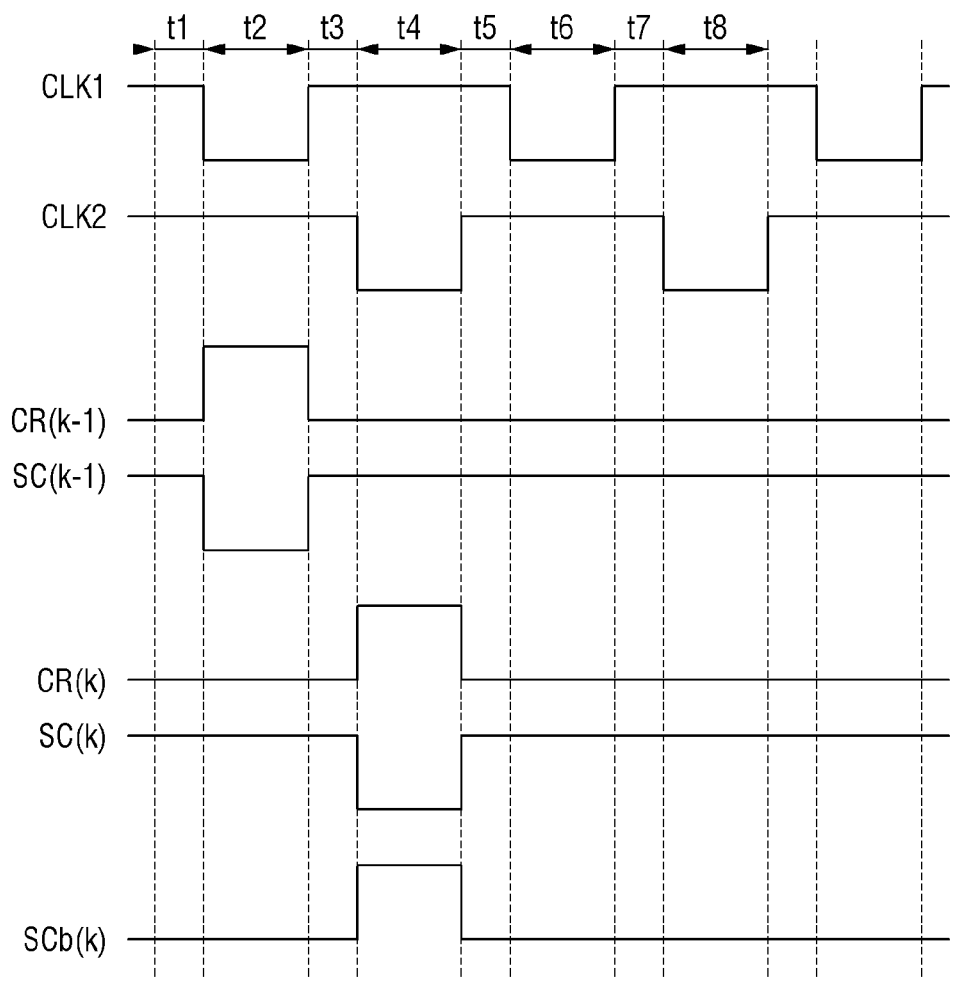
FIG. 10 is a waveform diagram illustrating input and output signals of a stage according to an embodiment.

FIG. 10 is a waveform diagram illustrating input and output signals of a stage according to an embodiment.

Referring to FIG. 10, in an embodiment, the first clock signal CLK1 may be applied to the first clock terminal CT1 of the (2n−1)$^{th}$ stage STG(2n−1) and applied to the second clock terminal CT2 of the 2n$^{th}$ stage STG(2n). The second clock signal CLK2 may be applied to the second clock terminal CT2 of the (2n−1)$^{th}$ stage STG(2n−1) and applied to the first clock terminal CT1 of the 2n$^{th}$ stage STG(2n). Here, the (2n−1)$^{th}$ stage STG(2n−1) may be an odd-numbered stage, and the 2n$^{th}$ stage STG(2n) may be an even-numbered stage.

The (k−1)$^{th}$ carry signal CR(k−1) may be output from the first output terminal OUT1 of the (k−1)$^{th}$ stage STG(k−1) and applied to the first start terminal ST1 of the k$^{th}$ stage STG(k). The k$^{th}$ carry signal CR(k) may be output from the first output terminal OUT1 of the k$^{th}$ stage STG(k) and applied to the first start terminal ST1 of the (k+1)$^{th}$ stage STG(k+1).

The (k−1)$^{th}$ scan signal SC(k−1) may be output from the second output terminal OUT2 of the (k−1)$^{th}$ stage STG(k−1). The (k−1)$^{th}$ scan signal SC(k−1) may be applied to the second start terminal ST2 of the k$^{th}$ stage STG(k) and applied to second and third switching transistors ST2 and ST3 of pixels arranged in a (k−1)$^{th}$ row.

The k$^{th}$ scan signal SC(k) may be output from the second output terminal OUT2 of the k$^{th}$ stage STG(k). The k$^{th}$ scan signal SC(k) may be applied to the second start terminal ST2 of the (k+1)$^{th}$ stage STG(k+1) and applied to second and third switching transistors ST2 and ST3 of pixels arranged in a k$^{th}$ row.

The k$^{th}$ inverted scan signal SCb(k) may be output from the third output terminal OUT3 of the k$^{th}$ stage STG(k). The k$^{th}$ inverted scan signal SCb(k) may be applied to fourth switching transistors ST4 of the pixels arranged in the k$^{th}$ row.

Each of the k$^{th}$ carry signal CR(k), the k$^{th}$ scan signal SC(k), and the k$^{th}$ inverted scan signal SCb(k) may be repeated in a period of one frame interval. In one embodiment, for example, the k$^{th}$ carry signal CR(k) and the k$^{th}$ inverted scan signal SCb(k) may have the gate high voltage VGH during one horizontal period of one frame interval and have the gate low voltage VGL during the remaining period thereof. The k$^{th}$ scan signal SC(k) may have the gate low voltage VGL during one horizontal period of one frame interval and have the gate high voltage VGH during the remaining period thereof.

FIGS. 11 to 18 are diagrams illustrating an operation of a k$^{th}$ stage during first to eighth periods of FIG. 10.

Figure 11:
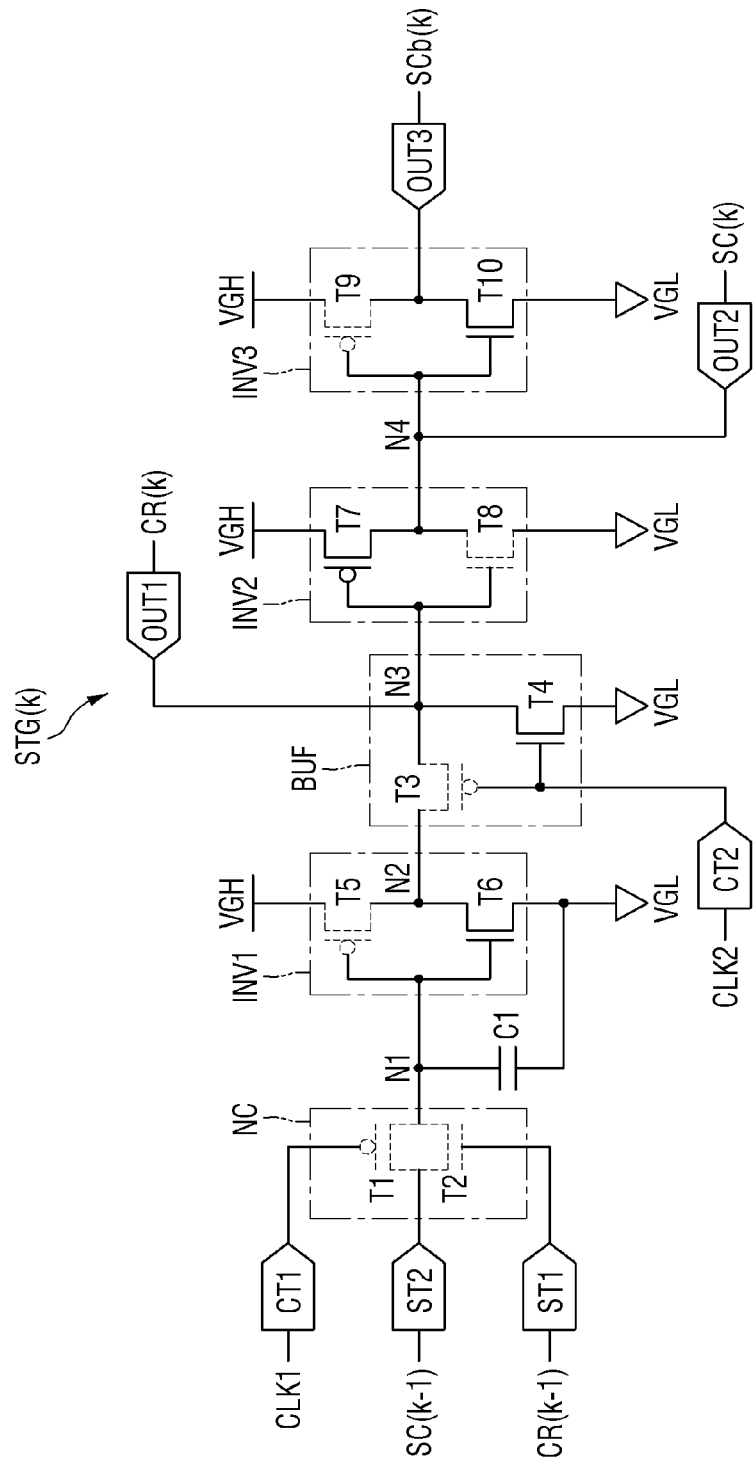
FIGS. 11 to 18 are diagrams illustrating an operation of a $k^{th}$ stage during first to eighth periods of FIG. 10.

Referring to FIGS. 10 and 11, during a first period t1, the first clock terminal CT1 of the k$^{th}$ stage STG(k) may receive the first clock signal CLK1 having the gate high voltage VGH, and the second clock terminal CT2 thereof may receive the second clock signal CLK2 having the gate high voltage VGH. The first start terminal ST1 of the k$^{th}$ stage STG(k) may receive the (k−1)$^{th}$ carry signal CR(k−1) having the gate low voltage VGL, and the second start terminal ST2 thereof may receive the (k−1)$^{th}$ scan signal SC(k−1) having the gate high voltage VGH during the first period t1.

The first transistor T1 of the node controller NC may be turned off based on the first clock signal CLK1 having the gate high voltage VGH, and the second transistor T2 thereof may be turned off based on the (k−1)$^{th}$ carry signal CR(k−1) having the gate low voltage VGL.

The first node N1 may have a gate high voltage VGH stored in a previous period based on capacitance of the capacitor C1. Thus, the fifth transistor T5 of the first inverter INV1 is turned off and the sixth transistor T6 thereof is turned on, such that the second node N2 may be discharged in the gate low voltage VGL during the first period t1.

The third transistor T3 of the buffer BUF may be turned off based on the second clock signal CLK2 having the gate high voltage VGH, and the fourth transistor T4 thereof may be turned on based on the second clock signal CLK2. Thus, the third node N3 may be discharged in the gate low voltage VGL, and the buffer BUF may output the $k^{th}$ carry signal CR(k) of the gate low voltage VGL through the first output terminal OUT1 during the first period t1.

The seventh transistor T7 of the second inverter INV2 may be turned on based on the voltage of the third node N3 having the gate low voltage VGL, and the eighth transistor T8 thereof may be turned off based on the voltage of the third node N3. Thus, the second inverter INV2 may output the $k^{th}$ scan signal SC(k) of the gate high voltage VGH through the second output terminal OUT2 during the first period t1.

The ninth transistor T9 of the third inverter INV3 may be turned off based on the voltage of the fourth node N4 having the gate high voltage VGH, and the tenth transistor T10 may be turned on based on the voltage of the fourth node N4. Thus, the third inverter INV3 may output the $k^{th}$ inverted scan signal SCb(k) of the gate low voltage VGL through the third output terminal OUT3 during the first period t1.

Figure 12:
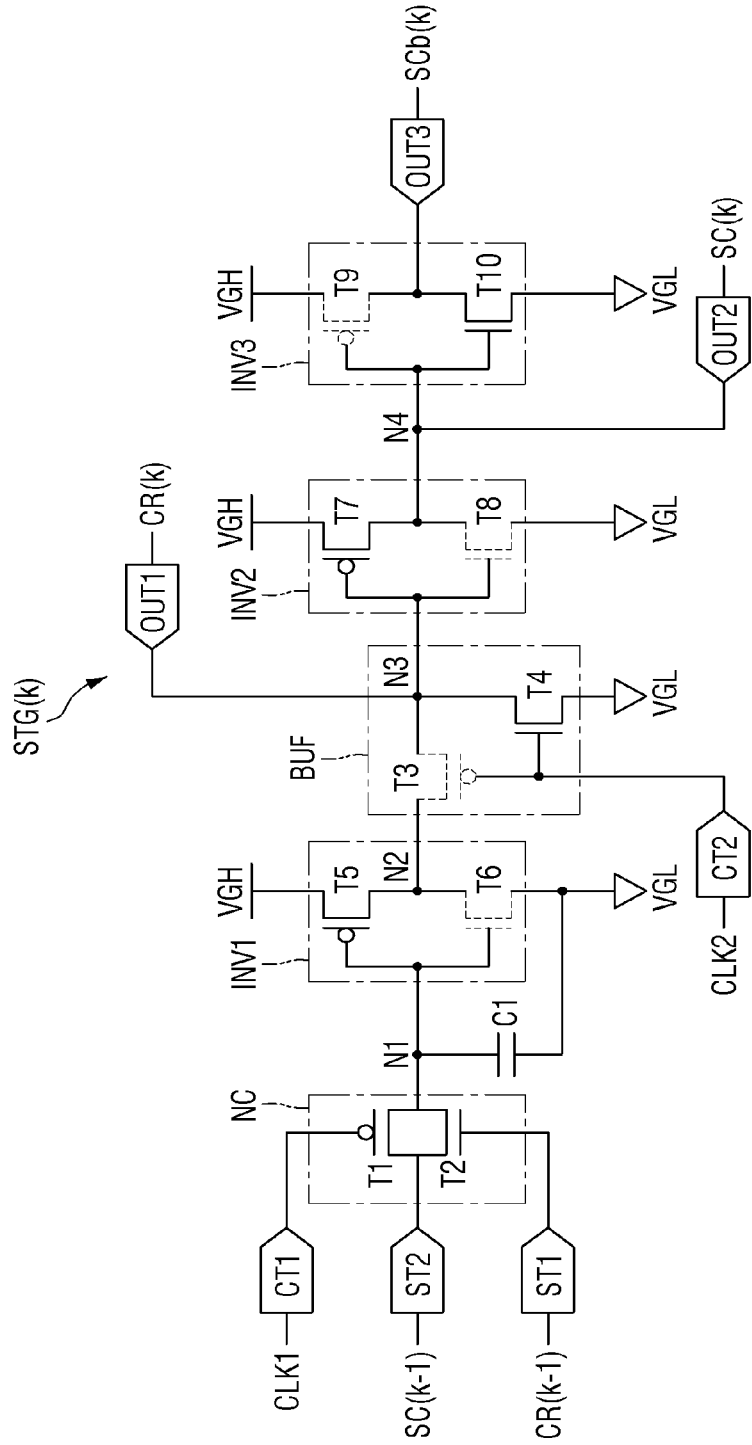

Referring to FIGS. 10 and 12, during a second period t2, the first clock terminal CT1 of the $k^{th}$ stage STG(k) may receive the first clock signal CLK1 having the gate low voltage VGL, and the second clock terminal CT2 thereof may receive the second clock signal CLK2 having the gate high voltage VGH. The first start terminal ST1 of the $k^{th}$ stage STG(k) may receive the $(k-1)^{th}$ carry signal CR(k-1) having the gate high voltage VGH, and the second start terminal ST2 thereof may receive the $(k-1)^{th}$ scan signal SC(k-1) having the gate low voltage VGL during the second period t2.

The first transistor T1 of the node controller NC may be turned on based on the first clock signal CLK1 having the gate low voltage VGL, and the second transistor T2 thereof may be turned on based on the $(k-1)^{th}$ carry signal CR(k-1) having the gate high voltage VGH. Thus, the first and second transistors T1 and T2 of the node controller NC may supply the $(k-1)^{th}$ scan signal SC(k-1) of the gate low voltage VGL to the first node N1 during the second period t2.

The fifth transistor T5 of the first inverter INV1 may be turned on based on the voltage of the first node N1 having the gate low voltage VGL, and the sixth transistor T6 thereof may be turned off based on the voltage of the first node N1. Thus, the first inverter INV1 may supply the gate high voltage VGH to the second node N2 during the second period t2.

The third transistor T3 of the buffer BUF may be turned off based on the second clock signal CLK2 having the gate high voltage VGH, and the fourth transistor T4 thereof may be turned on based on the second clock signal CLK2. Thus, the third node N3 may be discharged in the gate low voltage VGL, and the buffer BUF may output the $k^{th}$ carry signal CR(k) of the gate low voltage VGL through the first output terminal OUT1 during the second period t2.

The seventh transistor T7 of the second inverter INV2 may be turned on based on the voltage of the third node N3 having the gate low voltage VGL, and the eighth transistor T8 thereof may be turned off based on the voltage of the third node N3. Thus, the second inverter INV2 may output the $k^{th}$ scan signal SC(k) of the gate high voltage VGH through the second output terminal OUT2 during the second period t2.

The ninth transistor T9 of the third inverter INV3 may be turned off based on the voltage of the fourth node N4 having the gate high voltage VGH, and the tenth transistor T10 may be turned on based on the voltage of the fourth node N4. Thus, the third inverter INV3 may output the $k^{th}$ inverted scan signal SCb(k) of the gate low voltage VGL through the third output terminal OUT3 during the second period t2.

Figure 13:
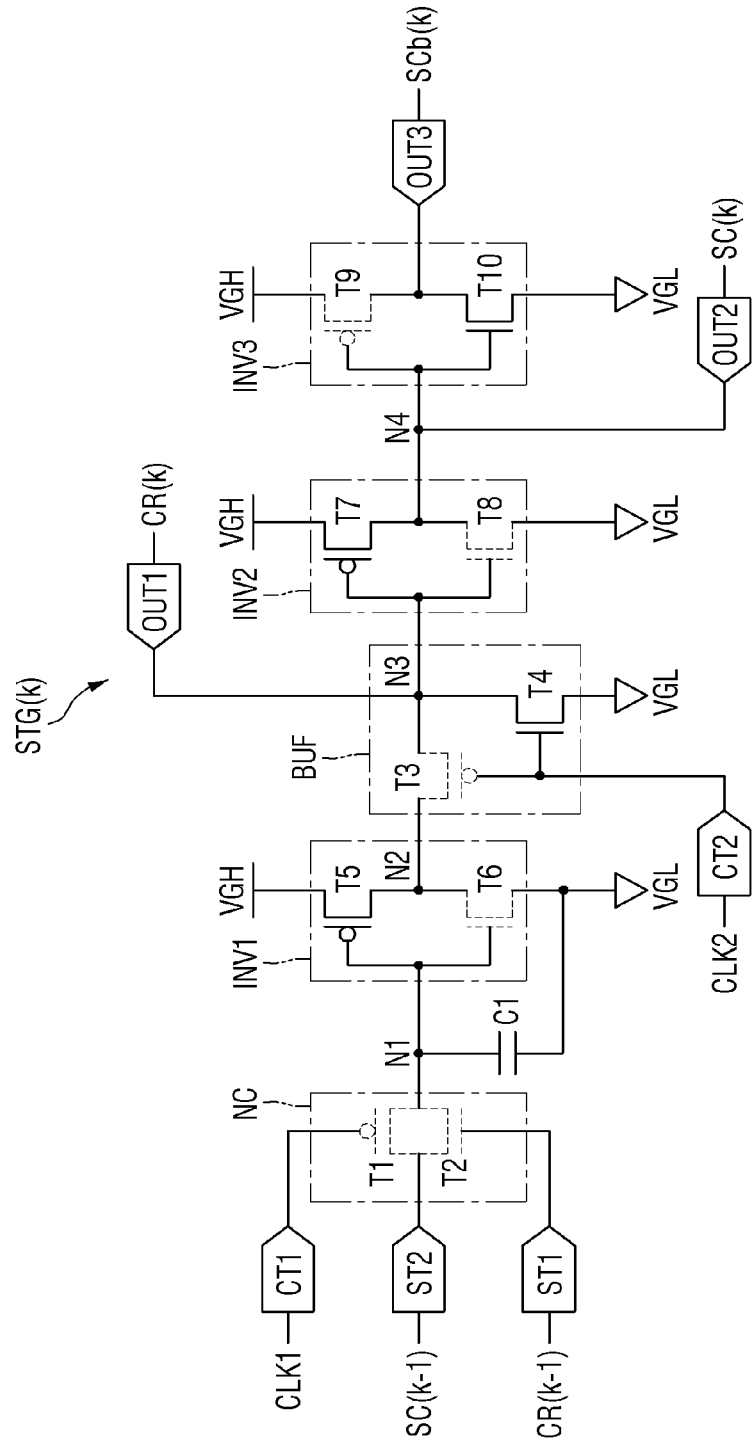

Referring to FIGS. 10 and 13, during a third period t3, the first clock terminal CT1 of the $k^{th}$ stage STG(k) may receive the first clock signal CLK1 having the gate high voltage VGH, and the second clock terminal CT2 thereof may receive the second clock signal CLK2 having the gate high voltage VGH. The first start terminal ST1 of the $k^{th}$ stage STG(k) may receive the $(k-1)^{th}$ carry signal CR(k-1) having the gate low voltage VGL, and the second start terminal ST2 thereof may receive the $(k-1)^{th}$ scan signal SC(k-1) having the gate high voltage VGH during the third period t3.

The first transistor T1 of the node controller NC may be turned off based on the first clock signal CLK1 having the gate high voltage VGH, and the second transistor T2 thereof may be turned off based on the $(k-1)^{th}$ carry signal CR(k-1) having the gate low voltage VGL.

The first node N1 may have the gate low voltage VGL stored during the second period t2 based on the capacitance of the capacitor C1.

The fifth transistor T5 of the first inverter INV1 may be turned on based on the voltage of the first node N1 having the gate low voltage VGL, and the sixth transistor T6 thereof may be turned off based on the voltage of the first node N1. Thus, the first inverter INV1 may supply the gate high voltage VGH to the second node N2 during the third period t3.

The third transistor T3 of the buffer BUF may be turned off based on the second clock signal CLK2 having the gate high voltage VGH, and the fourth transistor T4 thereof may be turned on based on the second clock signal CLK2. Thus, the third node N3 may be discharged in the gate low voltage VGL, and the buffer BUF may output the $k^{th}$ carry signal CR(k) of the gate low voltage VGL through the first output terminal OUT1 during the third period t3.

The seventh transistor T7 of the second inverter INV2 may be turned on based on the voltage of the third node N3 having the gate low voltage VGL, and the eighth transistor T8 thereof may be turned off based on the voltage of the third node N3. Thus, the second inverter INV2 may output the $k^{th}$ scan signal SC(k) of the gate high voltage VGH through the second output terminal OUT2 during the third period t3.

The ninth transistor T9 of the third inverter INV3 may be turned off based on the voltage of the fourth node N4 having the gate high voltage VGH, and the tenth transistor T10 may be turned on based on the voltage of the fourth node N4. Thus, the third inverter INV3 may output the $k^{th}$ inverted scan signal SCb(k) of the gate low voltage VGL through the third output terminal OUT3 during the third period t3.

Figure 14:
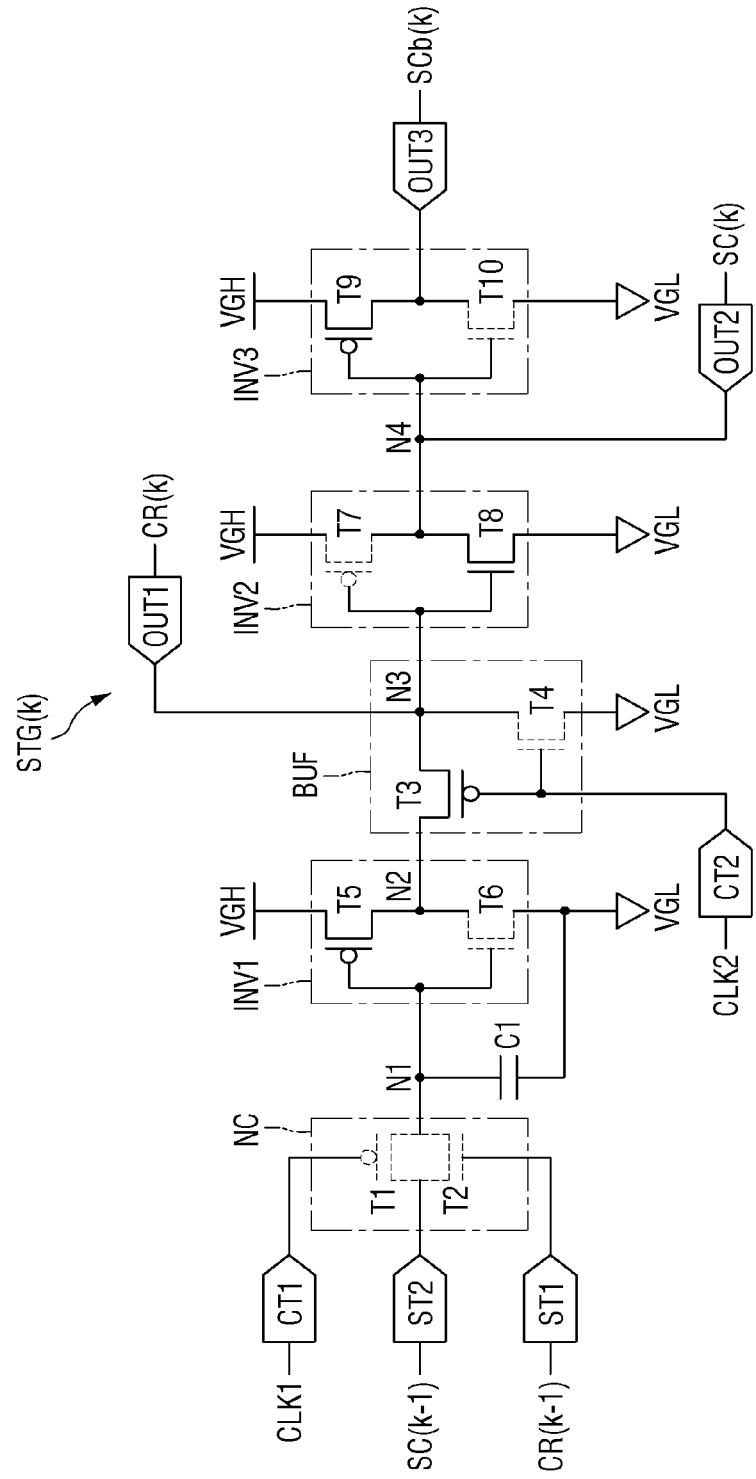

Referring to FIGS. 10 and 14, during a fourth period t4, the first clock terminal CT1 of the $k^{th}$ stage STG(k) may receive the first clock signal CLK1 having the gate high voltage VGH, and the second clock terminal CT2 thereof may receive the second clock signal CLK2 having the gate low voltage VGL. The first start terminal ST1 of the $k^{th}$ stage STG(k) may receive the $(k-1)^{th}$ carry signal CR(k-1) having the gate low voltage VGL, and the second start terminal ST2 thereof may receive the $(k-1)^{th}$ scan signal SC(k-1) having the gate high voltage VGH during the fourth period t4.

The first transistor T1 of the node controller NC may be turned off based on the first clock signal CLK1 having the gate high voltage VGH, and the second transistor T2 thereof may be turned off based on the $(k-1)^{th}$ carry signal CR(k-1) having the gate low voltage VGL.

The first node N1 may have the gate low voltage VGL stored during the third period t3 based on the capacitance of the capacitor C1.

The fifth transistor T5 of the first inverter INV1 may be turned on based on the voltage of the first node N1 having the gate low voltage VGL, and the sixth transistor T6 thereof may be turned off based on the voltage of the first node N1. Thus, the first inverter INV1 may supply the gate high voltage VGH to the second node N2 during the fourth period t4.

The third transistor T3 of the buffer BUF may be turned on based on the second clock signal CLK2 having the gate low voltage VGL, and the fourth transistor T4 thereof may be turned off based on the second clock signal CLK2. Thus, the buffer BUF may supply the gate high voltage VGH to the third node N3 and output the $k^{th}$ carry signal CR(k) of the gate high voltage VGH through the first output terminal OUT1 during the fourth period t4.

The seventh transistor T7 of the second inverter INV2 may be turned off based on the voltage of the third node N3 having the gate high voltage VGH, and the eighth transistor T8 thereof may be turned on based on the voltage of the third node N3. Thus, the second inverter INV2 may output the $k^{th}$ scan signal SC(k) of the gate low voltage VGL through the second output terminal OUT2 during the fourth period t4. The $k^{th}$ scan signal SC(k) of the gate low voltage VGL may be supplied to the sub-pixel SP to turn on the second and third switching transistors ST2 and ST3 of the sub-pixel SP.

The ninth transistor T9 of the third inverter INV3 may be turned on based on the voltage of the fourth node N4 having the gate low voltage VGL, and the tenth transistor T10 thereof may be turned off based on the voltage of the fourth node N4. Thus, the third inverter INV3 may output the $k^{th}$ inverted scan signal SCb(k) of the gate high voltage VGH through the third output terminal OUT3 during the fourth period t4. The $k^{th}$ inverted scan signal SCb(k) of the gate high voltage VGH may be supplied to the sub-pixel SP to turn on the fourth switching transistor ST4 of the sub-pixel SP.

Figure 15:
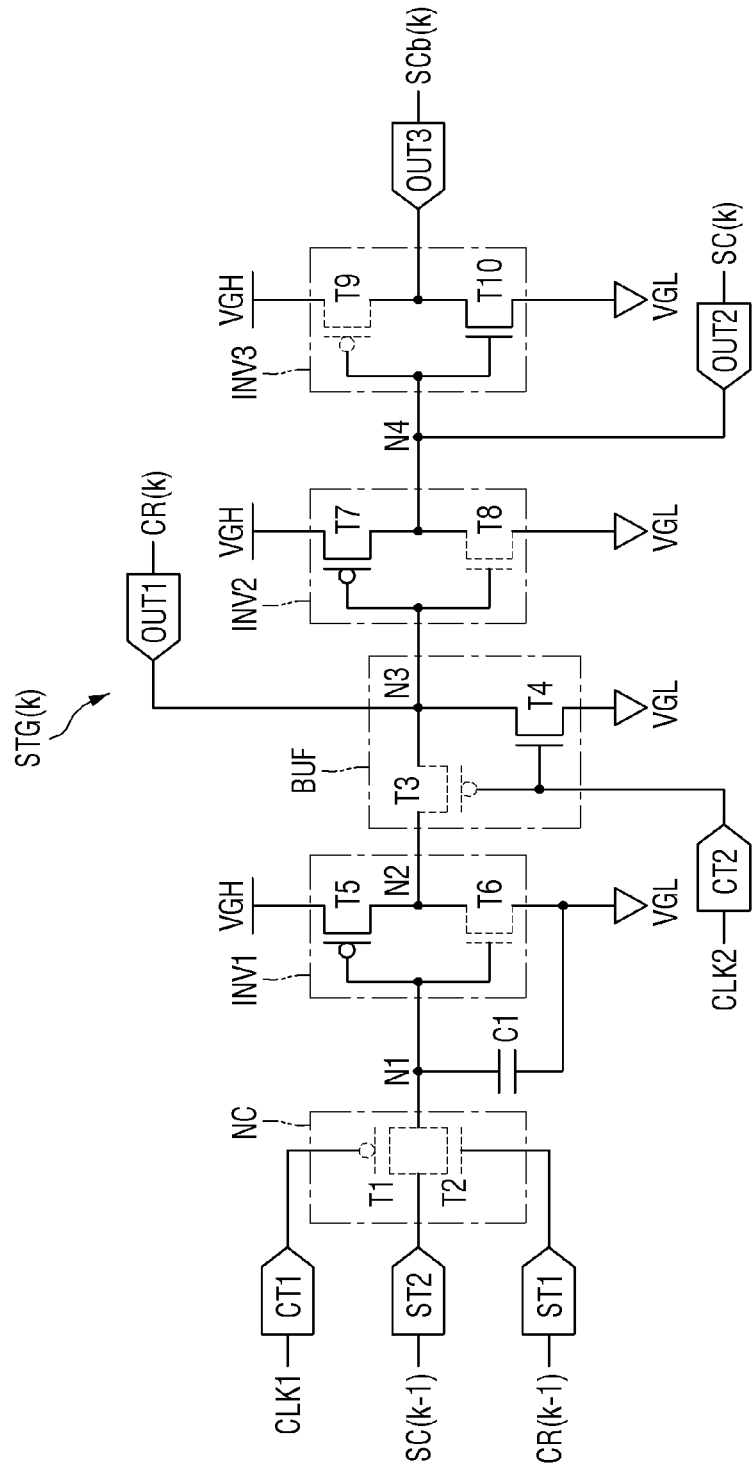

Referring to FIGS. 10 and 15, during a fifth period t5, the first clock terminal CT1 of the $k^{th}$ stage STG(k) may receive the first clock signal CLK1 having the gate high voltage VGH, and the second clock terminal CT2 thereof may receive the second clock signal CLK2 having the gate high voltage VGH. The first start terminal ST1 of the $k^{th}$ stage STG(k) may receive the $(k-1)^{th}$ carry signal CR(k-1) having the gate low voltage VGL, and the second start terminal ST2 thereof may receive the $(k-1)^{th}$ scan signal SC(k-1) having the gate high voltage VGH during the fifth period t5.

The first transistor T1 of the node controller NC may be turned off based on the first clock signal CLK1 having the gate high voltage VGH, and the second transistor T2 thereof may be turned off based on the $(k-1)^{th}$ carry signal CR(k-1) having the gate low voltage VGL.

The first node N1 may have the gate low voltage VGL stored during the fourth period t4 based on the capacitance of the capacitor C1.

The fifth transistor T5 of the first inverter INV1 may be turned on based on the voltage of the first node N1 having the gate low voltage VGL, and the sixth transistor T6 thereof may be turned off based on the voltage of the first node N1. Thus, the first inverter INV1 may supply the gate high voltage VGH to the second node N2 during the fifth period t5.

The third transistor T3 of the buffer BUF may be turned off based on the second clock signal CLK2 having the gate high voltage VGH, and the fourth transistor T4 thereof may be turned on based on the second clock signal CLK2. Thus, the third node N3 may be discharged in the gate low voltage VGL, and the buffer BUF may output the $k^{th}$ carry signal CR(k) of the gate low voltage VGL through the first output terminal OUT1 during the fifth period t5.

The seventh transistor T7 of the second inverter INV2 may be turned on based on the voltage of the third node N3 having the gate low voltage VGL, and the eighth transistor T8 thereof may be turned off based on the voltage of the third node N3. Thus, the second inverter INV2 may output the $k^{th}$ scan signal SC(k) of the gate high voltage VGH through the second output terminal OUT2 during the fifth period t5.

The ninth transistor T9 of the third inverter INV3 may be turned off based on the voltage of the fourth node N4 having the gate high voltage VGH, and the tenth transistor T10 thereof may be turned on based on the voltage of the fourth node N4. Thus, the third inverter INV3 may output the $k^{th}$ inverted scan signal SCb(k) of the gate low voltage VGL through the third output terminal OUT3 during the fifth period t5.

Figure 16:
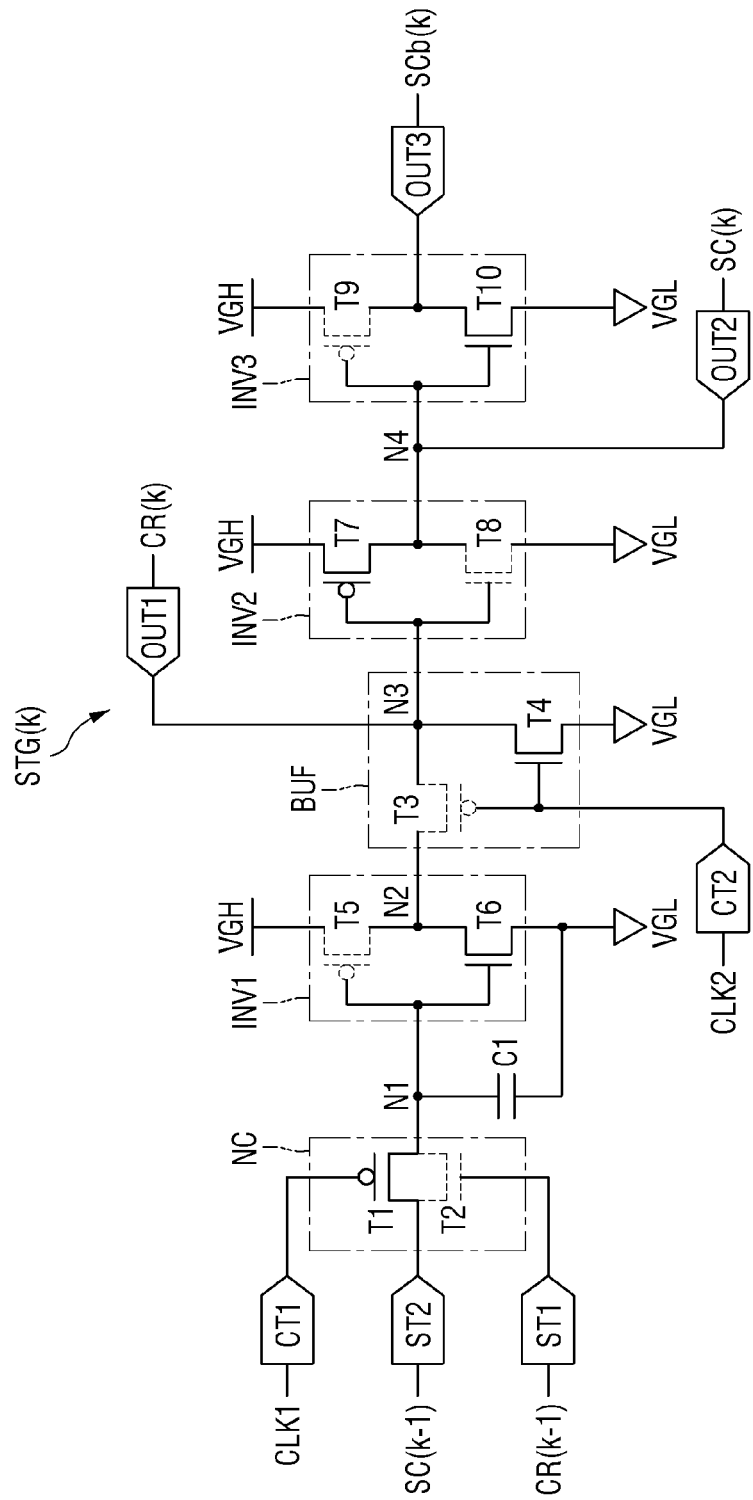

Referring to FIGS. 10 and 16, during a sixth period t6, the first clock terminal CT1 of the $k^{th}$ stage STG(k) may receive the first clock signal CLK1 having the gate low voltage VGL, and the second clock terminal CT2 thereof may receive the second clock signal CLK2 having the gate high voltage VGH. The first start terminal ST1 of the $k^{th}$ stage STG(k) may receive the $(k-1)^{th}$ carry signal CR(k-1) having the gate low voltage VGL, and the second start terminal ST2 thereof may receive the $(k-1)^{th}$ scan signal SC(k-1) having the gate high voltage VGH during the six period t6.

The first transistor T1 of the node controller NC may be turned on based on the first clock signal CLK1 having the gate low voltage VGL, and the second transistor T2 thereof may be turned off based on the $(k-1)^{th}$ carry signal CR(k-1) having the gate low voltage VGL. Thus, the first transistor T1 of the node controller NC may supply the $(k-1)^{th}$ scan signal SC(k-1) having the gate high voltage VGH to the first node N1 during the six period t6.

The fifth transistor T5 of the first inverter INV1 may be turned off based on the voltage of the first node N1 having the gate high voltage VGH, and the sixth transistor T6 thereof may be turned on based on the voltage of the first node N1. Consequently, the second node N2 may be discharged in the gate low voltage VGL.

The third transistor T3 of the buffer BUF may be turned off based on the second clock signal CLK2 having the gate high voltage VGH, and the fourth transistor T4 thereof may be turned on based on the second clock signal CLK2. Thus, the third node N3 may be discharged in the gate low voltage VGL, and the buffer BUF may output the $k^{th}$ carry signal CR(k) of the gate low voltage VGL through the first output terminal OUT1 during the six period t6.

The seventh transistor T7 of the second inverter INV2 may be turned on based on the voltage of the third node N3 having the gate low voltage VGL, and the eighth transistor T8 thereof may be turned off based on the voltage of the third node N3. Thus, the second inverter INV2 may output the $k^{th}$ scan signal SC(k) of the gate high voltage VGH through the second output terminal OUT2 during the six period t6.

The ninth transistor T9 of the third inverter INV3 may be turned off based on the voltage of the fourth node N4 having the gate high voltage VGH, and the tenth transistor T10 thereof may be turned on based on the voltage of the fourth node N4. Thus, the third inverter INV3 may output the $k^{th}$ inverted scan signal SCb(k) of the gate low voltage VGL through the third output terminal OUT3 during the six period t6.

Figure 17:
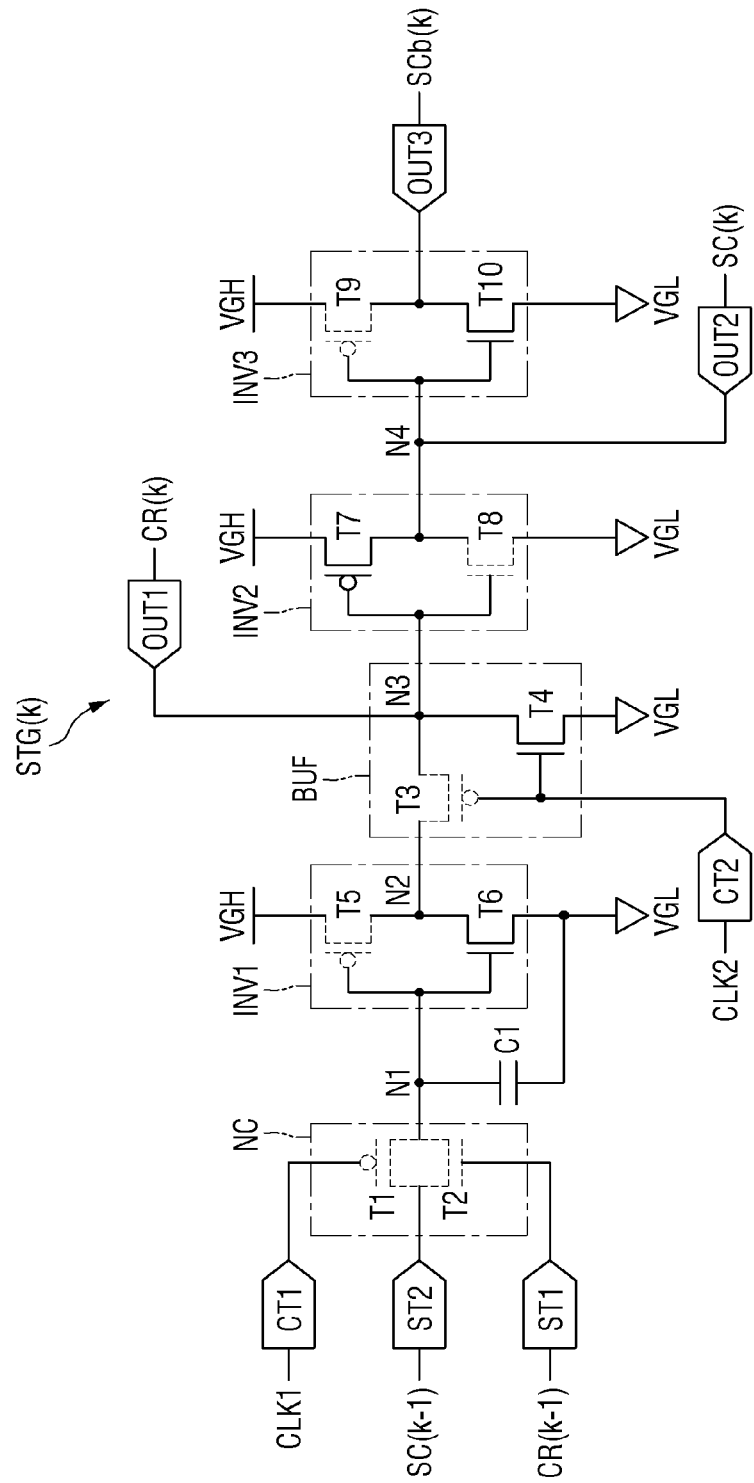
Figure 18:
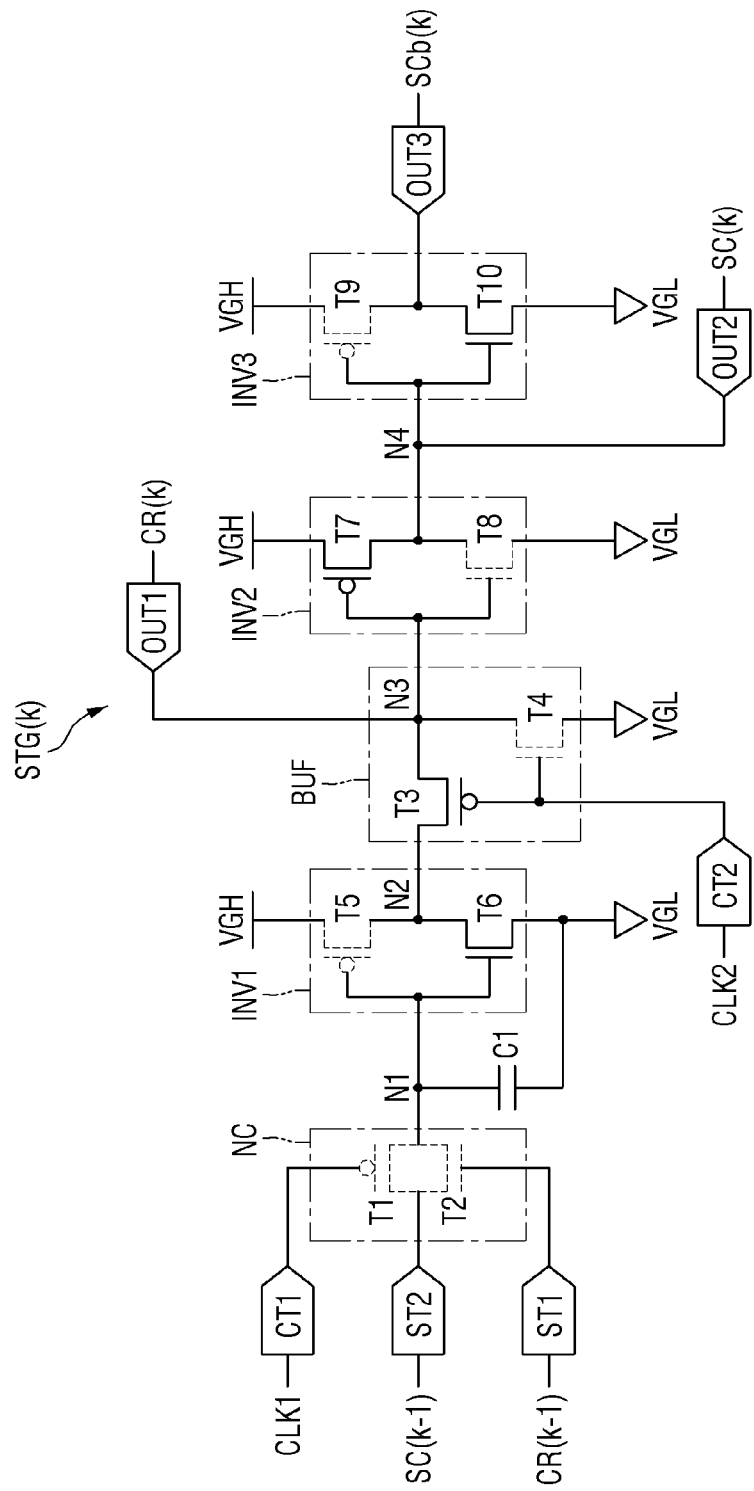

Referring to FIGS. 10, 17 and 18, during a seventh period t7 and an eighth period t8, the first and second transistors T1 and T2 may be turned off. Thus, the first node N1 may have the gate high voltage VGH stored during the sixth period t6 based on the capacitance of the capacitor C1 during the seventh period t7.

From the seventh period t7 before a next frame starts, the $(k-1)^{th}$ scan signal SC(k-1) may have the gate high voltage VGH, and, even when the first transistor T1 is turned on, the first node N1 may have the gate high voltage VGH.

The first inverter INV1 may invert the voltage of the first node N1 to supply the gate low voltage VGL to the second node N2.

From the seventh period t7 before the next frame starts, when the third transistor T3 is turned on based on the second clock signal CLK2, the buffer BUF may supply the voltage of the second node N2 having the gate low voltage VGL to the third node N3, and, when the fourth transistor T4 is turned on, the buffer BUF may discharge the third node N3. Therefore, from the seventh period t7 before the next frame starts, the buffer BUF may maintain the voltage of the third node N3 at the gate low voltage VGL.

The second inverter INV2 may invert the voltage of the third node N3 to supply the gate high voltage VGH to the fourth node N4.

The third inverter INV3 may invert the voltage of the fourth node N4 to supply the gate low voltage VGL to the third output terminal OUT3.

In accordance with embodiments of a display device according to the invention, each stage receives a clock signal and a carry signal and a scan signal of a previous stage. Each of the stages includes at least one inverter such that a width of the scan signal being output may be maintained to be equal to that of the clock signal while a voltage of a first node may be maintained constant.

In accordance with embodiments of the display device according to the invention, each of the stages includes a capacitor connected to a first node and at least one inverter connected to at least one output terminal from the first node such that scan signals of a gate high voltage and a gate low voltage may be output without using bootstrapping. Therefore, current driving capability of a scan driver is relatively improved, and a circuit area and power consumption are reduced such that reliability of the display device may be improved.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device comprising:
  a plurality of pixels, wherein each of the pixels is connected to a corresponding one of a plurality of scan lines; and
  a scan driver comprising a plurality of stages, wherein each of the stages supplies a scan signal to a corresponding one of the scan lines,
  wherein each of the stages comprises:
  a node controller which supplies a second output signal of a previous stage to a first node based on an input signal of a first clock terminal or a first output signal of the previous stage;
  a first inverter connected between the first node and a second node;
  a buffer which supplies a voltage of the second node to a first output terminal based on an input signal of a second clock terminal; and
  a second inverter connected directly between the first output terminal and a second output terminal,
  wherein the node controller comprises:
  a first transistor which supplies the second output signal of the previous stage to the first node, when the input signal of the first clock terminal has a gate low voltage; and
  a second transistor which supplies the second output signal of the previous stage to the first node, when the first output signal of the previous stage has a gate high voltage.

2. The display device of claim 1, wherein:
  a gate electrode of the first transistor is connected to the first clock terminal of the stage, a first electrode of the first transistor is connected to a second start terminal of the stage, and a second electrode of the first transistor is connected to the first node; and
  a gate electrode of the second transistor is connected to a first start terminal of the stage, a first electrode of the second transistor is connected to the second start terminal of the stage, and a second electrode of the second transistor is connected to the first node.

3. The display device of claim 1, wherein the first inverter comprises:
  a fifth transistor which supplies a gate high voltage to the second node, when the first node has a gate low voltage; and
  a sixth transistor which supplies the gate low voltage to the second node, when the first node has the gate high voltage.

4. The display device of claim 3, wherein:
  a gate electrode of the fifth transistor is connected to the first node, a first electrode of the fifth transistor is connected to a gate high voltage line which supplies the gate high voltage, and a second electrode of the fifth transistor is connected to the second node; and
  a gate electrode of the sixth transistor is connected to the first node, a first electrode of the sixth transistor is connected to the second node, and a second electrode of the sixth transistor is connected to a gate low voltage line which supplies the gate low voltage.

5. The display device of claim 1, wherein the second inverter comprises:
  a seventh transistor which supplies a gate high voltage to the second output terminal, when the first output terminal has a gate low voltage; and
  an eighth transistor which supplies the gate low voltage to the second output terminal, when the first output terminal has the gate high voltage.

6. The display device of claim 5, wherein:
  a gate electrode of the seventh transistor is connected to the first output terminal, a first electrode of the seventh transistor is connected to a gate high voltage line which supplies the gate high voltage, and a second electrode of the seventh transistor is connected to the second output terminal; and
a gate electrode of the eighth transistor is connected to the first output terminal, a first electrode of the eighth transistor is connected to the second output terminal, and a second electrode of the eighth transistor is connected to a gate low voltage line which supplies the gate low voltage.

7. The display device of claim 1, wherein each of the stages further comprises a third inverter connected between the second output terminal and a third output terminal.

8. The display device of claim 7, wherein the third inverter comprises:
a ninth transistor which supplies a gate high voltage to the third output terminal, when the second output terminal has a gate low voltage; and
a tenth transistor which supplies the gate low voltage to the third output terminal, when the second output terminal has the gate high voltage.

9. The display device of claim 8, wherein:
a gate electrode of the ninth transistor is connected to the second output terminal, a first electrode of the ninth transistor is connected to a gate high voltage line which supply the gate high voltage, and a second electrode of the ninth transistor is connected to the third output terminal; and
a gate electrode of the tenth transistor is connected to the second output terminal, a first electrode of the tenth transistor is connected to the third output terminal, and a second electrode of the tenth transistor is connected to a gate low voltage line which supplies the gate low voltage.

10. The display device of claim 7, wherein each of the plurality of pixels comprises:
a light-emitting element;
a driving transistor which controls a drive current flowing in the light-emitting element;
a first switching transistor which selectively supplies an initialization voltage to a gate electrode of the driving transistor;
a second switching transistor which selectively supplies a data voltage to a first electrode of the driving transistor;
a third switching transistor which selectively connects a second electrode of the driving transistor to the gate electrode thereof;
a fourth switching transistor which selectively supplies the initialization voltage to a first electrode of the light-emitting element;
a fifth switching transistor which selectively supplies a drive voltage to the first electrode of the driving transistor; and
a sixth switching transistor which selectively connects the second electrode of the driving transistor to the first electrode of the light-emitting element.

11. The display device of claim 10, wherein the second switching transistors and the third switching transistors of the pixels arranged in a $k^{th}$ row among the plurality of pixels are turned on based on an output signal of the second output terminal of a $k^{th}$ stage among the stages, wherein k is a natural number of two or greater.

12. The display device of claim 10, wherein the first switching transistors of the pixels arranged in a $k^{th}$ row among the plurality of pixels are turned on based on an output signal of the third output terminal of a $(k-1)^{th}$ stage among the stages.

13. The display device of claim 10, wherein the fourth switching transistors of the pixels arranged in a $k^{th}$ row among the plurality of pixels are turned on based on an output signal of the third output terminal of a $k^{th}$ stage among the stages, wherein k is a natural number of two or greater.

14. The display device of claim 10, wherein types of the first switching transistor and the fourth switching transistor are different from types of the second switching transistor and the third switching transistor.

15. The display device of claim 1, wherein:
a $(2n-1)^{th}$ stage among the stages receives a first clock signal at the first clock terminal and receives a second clock signal at the second clock terminal, wherein n is a natural number; and
a $2n^{th}$ stage among the stages receives the second clock signal at the first clock terminal and receives the first clock signal at the second clock terminal.

16. The display device of claim 1, wherein a first start terminal of a $k^{th}$ stage among the stages is connected to a first output terminal of a $(k-1)^{th}$ stage, and a second start terminal of the $k^{th}$ stage is connected to a second output terminal of the $(k-1)^{th}$ stage, wherein k is a natural number of two or greater.

17. A display device comprising:
a plurality of pixels, wherein each of the pixels is connected to a corresponding one of a plurality of scan lines; and
a scan driver comprising a plurality of stages, wherein each of the stages supplies a scan signal to a corresponding one of the scan lines,
wherein each of the stages comprises:
a node controller which supplies a second output signal of a previous stage to a first node based on an input signal of a first clock terminal or a first output signal of the previous stage;
a first inverter connected between the first node and a second node;
a buffer which supplies a voltage of the second node to a first output terminal based on an input signal of a second clock terminal; and
a second inverter connected between the first output terminal and a second output terminal,
wherein the buffer comprises:
a third transistor which supplies the voltage of the second node to the first output terminal, when the input signal of the second clock terminal has a gate low voltage; and
a fourth transistor which supplies the gate low voltage to the first output terminal, when the input signal of the second clock terminal has a gate high voltage.

18. The display device of claim 17, wherein:
a gate electrode of the third transistor is connected to the second clock terminal of the stage, a first electrode of the third transistor is connected to the second node, and a second electrode of the third transistor is connected to the first output terminal; and
a gate electrode of the fourth transistor is connected to the second clock terminal of the stage, a first electrode of the fourth transistor is connected to the first output terminal, and a second electrode of the fourth transistor is connected to a gate low voltage line which supplies the gate low voltage.

19. A display device comprising:
a plurality of pixels, wherein each of the pixels is connected to a corresponding one of a plurality of scan lines; and a scan driver comprising a plurality of stages, wherein each of the stages supplies a scan signal to a corresponding one of the scan lines, wherein each of the stages comprises:

a node controller which supplies a second output signal of a previous stage to a first node based on an input signal of a first clock terminal or a first output signal of the previous stage;

a first inverter connected between the first node and a second node;

a buffer which supplies a voltage of the second node to a first output terminal based on an input signal of a second clock terminal; and a second inverter connected between the first output terminal and a second output terminal, wherein each of the stages further comprises a capacitor connected directly between the first node and a gate low voltage line.

* * * * *